(12) United States Patent
Yang

(10) Patent No.: US 8,804,859 B2
(45) Date of Patent: Aug. 12, 2014

(54) METHODS AND APPARATUSES FOR DEALING WITH SPECTRUM INVERSION

(75) Inventor: Shun-An Yang, Hsinchu County (TW)

(73) Assignee: MediaTek, Inc., Science-Based Industrial Park, Hsin-Chu (TW)

(*) Notice: Subject to any disclaimer, the term of this patent is extended or adjusted under 35 U.S.C. 154(b) by 1046 days.

(21) Appl. No.: 12/390,500

(22) Filed: Feb. 23, 2009

(65) Prior Publication Data
US 2010/0215107 A1   Aug. 26, 2010

(51) Int. Cl.
*H04L 27/28* (2006.01)
*H04L 23/02* (2006.01)

(52) U.S. Cl.
USPC ........... 375/260; 375/340; 375/295; 375/343; 375/232; 375/341; 375/324; 375/262

(58) Field of Classification Search
USPC .................................................. 375/260, 262
See application file for complete search history.

(56) References Cited

U.S. PATENT DOCUMENTS

| | | | |
|---|---|---|---|
| 7,154,936 B2* | 12/2006 | Bjerke et al. | 375/148 |
| 2006/0088111 A1* | 4/2006 | Ye et al. | 375/260 |
| 2006/0098751 A1* | 5/2006 | Zhang et al. | 375/260 |
| 2006/0203932 A1* | 9/2006 | Palanki et al. | 375/295 |
| 2008/0028282 A1* | 1/2008 | Zhong et al. | 714/794 |
| 2008/0310551 A1* | 12/2008 | Lin et al. | 375/320 |
| 2009/0129477 A1* | 5/2009 | Yang | 375/240.24 |

FOREIGN PATENT DOCUMENTS

| | | |
|---|---|---|
| CN | 101174917 A | 5/2008 |
| TW | 200625890 A | 7/2006 |
| TW | I259671 | 8/2006 |

* cited by examiner

*Primary Examiner* — Shuwang Liu
*Assistant Examiner* — Ross Varndell
(74) *Attorney, Agent, or Firm* — Winston Hsu; Scott Margo

(57) ABSTRACT

An apparatus of processing a time domain synchronous orthogonal frequency-division-multiplexing (TDS-OFDM) signal is provided. The apparatus includes a receiving block and a demodulating block. The receiving block receives the TDS-OFDM signal, and generates a down-converted signal according to the received TDS-OFDM signal. The demodulating block is coupled to the receiving block, and demodulates the down-converted signal to generate a transport stream. The demodulating block has a transmission parameter signaling (TPS) decoder implemented for performing a TPS decoding operation to generate a TPS decoding result and verifying a spectrum direction of the received TDS-OFDM signal according to the TPS decoding result.

20 Claims, 13 Drawing Sheets

| | Codeword | Definition |
|---|---|---|
| 1 | 0001111010101110010010010110011 | First frame indication for even super frame |
| 2 | 1110000101010001101101110100110 | First frame indication for odd super frame |
| 3 | 0111100011001000001011011010101 | 4QAM-NR,LDPC code rate 3,interleave mode 1 |
| 4 | 1000011100110111101000100101010 | 4QAM-NR,LDPC code rate 3,interleave mode 2 |
| 5 | 0111011111000111001000011011010 | 4QAM,LDPC code rate 1,interleae mode 1 |
| 6 | 1000100000111000110111100010010 | 4QAM,LDPC code rate 1,interleave mode 2 |
| 7 | 0010001010010010011101001000111 | 4QAM,LDPC code rate 2,interleave mode 1 |
| 8 | 1101110101101101100010110110000 | 4QAM,LDPC code rate 2,interleave mode 2 |
| 9 | 0100101111110110001101111001100 | 4QAM,LDPC code rate 3,interleave mode 1 |
| 10 | 1011010000001001110001000011001 | 4QAM,LDPC code rate 3,interleave mode 2 |
| 11 | 0001000110100001010001110101111 | 16QAM,LDPC code rate 1,interleave mode 1 |
| 12 | 1110111001011110101110001000011 | 16QAM,LDPC code rate 1,interleave mode 2 |
| 13 | 0111100000110111001011100010101 | 16QAM,LDPC code rate 2,interleave mode 1 |
| 14 | 1000011110010001101000111010101 | 16QAM,LDPC code rate 2,interleave mode 2 |
| 15 | 0010110110011010111011100000000 | 16QAM,LDPC code rate 3,interleave mode 1 |
| 16 | 1101001001100010100001000111111 | 16QAM,LDPC code rate 3,interleave mode 2 |
| 17 | 0111011100111000001000010010010 | 32QAM,LDPC code rate 3,interleave mode 1 |
| 18 | 1000100011000111110111101101101 | 32QAM,LDPC code rate 3,interleave mode 2 |
| 19 | 0010001001101101011010001110000 | 64QAM,LDPC code rate 1,interleave mode 1 |
| 20 | 1101110110010010100010111000111 | 64QAM,LDPC code rate 1,interleave mode 2 |
| 21 | 0100010000001011000100100001011 | 64QAM,LDPC code rate 2,interleave mode 1 |
| 22 | 1011101111110100111011011110100 | 64QAM,LDPC code rate 2,interleave mode 2 |
| 23 | 0001000101011110010001110100001 | 64QAM,LDPC code rate 3,interleave mode 1 |
| 24 | 1110111010100001101110001011110 | 64QAM,LDPC code rate 3,interleave mode 2 |
| 25 | 0010110101100010011110110111111 | Reserved |
| 26 | 1101001010011011000010010000000 | Reserved |
| 27 | 0100010011110100000100101110100 | Reserved |
| 28 | 1011101100001011110110100010110 | Reserved |
| 29 | 0100101100001000011101000110010 | Reserved |
| 30 | 1011010011110111110001011100110 | Reserved |
| 31 | 0001111001010001010010000100110 | Reserved |
| 32 | 1110000110101110101101111011001 | Reserved |
| 33 | 0111100011001000110100010010101 | Reserved |
| 34 | 1000011100110111001011101101010 | Reserved |
| 35 | 0010110110011101100010001111111 | Reserved |

FIG. 4 RELATED ART

| 36 | 1101001001100010011111011110000000 | Reserved |
|---|---|---|
| 37 | 0100101111111011111110001000011001 | Reserved |
| 38 | 1011010000000100000111011110011 0 | Reserved |
| 39 | 0001111010101110101101110100110 0 | Reserved |
| 40 | 1110000101010001010010001011001 1 | Reserved |
| 41 | 0111011111000111110111100010010 1 | Reserved |
| 42 | 1000100000111000001000011101101 0 | Reserved |
| 43 | 0010001010010010100010110111000 0 | Reserved |
| 44 | 1101110110110101110100100011 11 | Reserved |
| 45 | 0100010011110100110110100001011 0 | Reserved |
| 46 | 1011101100001011000100101110100 1 | Reserved |
| 47 | 0001000110100001101110000100001 1 | Reserved |
| 48 | 1110111001011100100011110111110 0 | Reserved |
| 49 | 0111100000110111110100011101010 1 | Reserved |
| 50 | 1000011111001000001011100010101 0 | Reserved |
| 51 | 0010110101100010100001001000000 0 | Reserved |
| 52 | 1101001010011101011101101111111 1 | Reserved |
| 53 | 0100101100000100111000101110011 0 | Reserved |
| 54 | 1011010011110110001110100011001 | Reserved |
| 55 | 0001111001010001101101111011001 1 | Reserved |
| 56 | 1110000110101110010010000100110 0 | Reserved |
| 57 | 0111011100111000110111101101101 0 | Reserved |
| 58 | 1000100011000111001000010010010 1 | Reserved |
| 59 | 0010001001101101100010111000111 1 | Reserved |
| 60 | 1101110110010010011101000111000 0 | Reserved |
| 61 | 0100010000010111110110111101001 | Reserved |
| 62 | 1011101111101000001001000010110 | Reserved |
| 63 | 0001000101011110101110001011110 0 | Reserved |
| 64 | 1110111010100010100011101000001 1 | Reserved |

FIG. 5 RELATED ART

METHODS AND APPARATUSES FOR DEALING WITH SPECTRUM INVERSION

BACKGROUND

The present invention relates to processing a wireless communication signal, and more particularly, to methods and apparatuses for dealing with spectrum inversion of a wireless communication signal complying with a digital terrestrial television multimedia broadcasting (DTMB) standard, such as a time domain synchronous orthogonal frequency-division-multiplexing (TDS-OFDM) signal or a single carrier signal.

Quadrature amplitude modulation (QAM) is a modulation scheme which conveys data/information by modulating the amplitude of two carrier waves (e.g., sinusoid waves) out of phase with each other. In addition, some other modulation schemes can be regarded as special cases of QAM. For instance, phase-shift keying (PSK) can be regarded as a special case, where the magnitude of the modulated signal is a constant, with only the phase varying. In general, when transmitting two signals by modulating them with QAM, the transmitted signal S(t) will be of the following form:

$$S(t)=I(t)\cos(w_0 t)+Q(t)\sin(w_0 t)=I(t)\cos(2\pi f_0 t)+Q(t)\sin(2\pi f_0 t),$$

where I(t) and Q(t) are data to be transmitted, and $f_0$ is the carrier frequency.

In the receiver end, a down-conversion is employed to down-convert the received radio-frequency (RF) signal, i.e., S(t), into an intermediate frequency (IF) signal or a baseband signal. Suppose that a mixer is implemented to down-convert the RF signal S(t) into an IF signal using a local oscillation signal LO=cos(($w_0$+v)t). After the mixer output is filtered to remove high-frequency components, the resultant signal will be of the form: I(t)cos(-vt)+Q(t)sin(-vt). In another case where the mixer down-converts the RF signal S(t) into an IF signal using a local oscillation signal LO=cos(($w_0$-v)t), the resultant signal will be of the form: I(t)cos(vt)+Q(t)sin(vt).

A phenomenon, called spectrum inversion, might occur due to the transmitter end failing to transmit the real part and the imaginary part correctly or the architecture of the receiver end. As shown in FIG. 1, the desired signal transmitted from a transmitter end should have the spectrum TX_1. In this example, the center frequency of the transmission signal carrying the desired data is located at 666 MHz. However, if the transmitter end does not transmit the real part and the imaginary part properly, the actual signal transmitted from the transmitter end will have a different spectrum TX_2. As clearly shown in FIG. 1, the direction of the spectrum TX_2 is opposite to that of the spectrum TX_1. Thus, the aforementioned spectrum inversion happens. Regarding signal reception of the transmission signal (i.e., an RF signal) generated from the transmitter end, the received signal at a receiver end is converted to an intermediate frequency band. For example, the desired intermediate frequency is 36 MHz. As mentioned above, the local oscillation signal might affect the down-conversion result. Suppose that the spectrum direction is not inverse due to the architecture of the receiver end, the IF signal corresponding to the transmission signal with the spectrum TX_1 therefore has the spectrum IF_1 as shown in FIG. 1, and the IF signal corresponding to the transmission signal with the spectrum TX_2 therefore has the spectrum IF_2 as shown in FIG. 1. Next, the IF signal is processed in the following stage for data extraction. Based on the actual implementation of the receiver end, the IF signal will be down-converted to a baseband through mixers using adequate local oscillation signals. As shown in FIG. 1, the extracted signal corresponding to the IF signal with the spectrum IF_1 has the baseband spectrum Demod_1, whereas the extracted signal corresponding to the IF signal with the spectrum IF_2 has the baseband spectrum Demod_2 whose direction is opposite to that of the spectrum Demod_1. In this example, when the receiver end receives the transmission signal with the desired spectrum TX_1, the real part and imaginary part intended to be transmitted from the transmitter end can be correctly recovered from the extracted signal with the spectrum Demod_1. However, when the same receiver end receives the transmission signal with the inverse spectrum TX_2, the real part and imaginary part intended to be transmitted are not correctly recovered from the extracted signal with the spectrum Demod_2 due to spectrum inversion. In other words, the spectrum inversion would make the receiver end fail to decode the received input correctly, which degrades the performance of the receiver end greatly.

Therefore, method and apparatus capable of detecting the spectrum direction quickly and making the DTMB receiver adapted to the correct spectrum direction efficiently are needed.

SUMMARY

According to one aspect of the present invention, an apparatus capable of processing a time domain synchronous orthogonal frequency-division-multiplexing (TDS-OFDM) signal is provided. The apparatus includes: a receiving block for receiving the TDS-OFDM signal and generating a down-converted signal according to the received TDS-OFDM signal, and a demodulating block coupled to the receiving block for demodulating the down-converted signal to generate a transport stream. The demodulating block includes a transmission parameter signaling (TPS) decoder implemented for performing a TPS decoding operation to generate a TPS decoding result and verifying a spectrum direction of the received TDS-OFDM signal according to the TPS decoding result.

According to another aspect of the present invention, an apparatus of processing a TDS-OFDM signal is provided. The apparatus includes: a receiving block for receiving the TDS-OFDM signal and generating a down-converted signal according to the received TDS-OFDM signal, and a demodulating block coupled to the receiving block for demodulating the down-converted signal to generate a transport stream. The demodulating block includes an LDPC decoder and an FFT device. The LDPC decoder is implemented for performing an LDPC decoding operation to generate an LDPC decoding result and verifying a spectrum direction of the received TDS-OFDM signal according to the LDPC decoding result. The demodulating block selectively adjusts at least one of a real part and an imaginary part of inputs received by the FFT device according to the spectrum direction verified by the LDPC decoder. The inputs include a data part and a channel part.

According to another aspect of the present invention, an apparatus of processing a non-NR-coded single carrier signal is provided. The apparatus includes: a receiving block for receiving the non-NR-coded single carrier signal and generating a down-converted signal according to the received non-NR-coded single carrier signal, and a demodulating block coupled to the receiving block for demodulating the down-converted signal to generate a transport stream. The demodulating block includes: a demapping device for generate a demapped signal, and an LDPC decoder coupled to the demapping device for decoding the demapped signal to generate an LDPC decoding result and verifying a spectrum direction of the received non-NR-coded single carrier signal according to the LDPC decoding result. The demodulating block selectively swaps a real part and an imaginary part of an input received by the demapping device according to the spectrum direction verified by the LDPC decoder.

According to another aspect of the present invention, an apparatus of processing an NR-coded wireless communication signal is provided. The apparatus includes: a receiving block for receiving the NR-coded wireless communication signal and generating a down-converted signal according to the received NR-coded wireless communication signal, and a demodulating block coupled to the receiving block for demodulating the down-converted signal to generate a transport stream. The demodulating block includes: a Nordstrom-Robinson (NR) decoder for performing an NR decoding operation to generate an NR decoding result and verifying a spectrum direction of the received NR-coded wireless communication signal according to the NR decoding result. The demodulating block selectively swaps a real part and an imaginary part of an input received by the NR decoder according to the spectrum direction verified by the NR decoder.

According to another aspect of the present invention, an apparatus of processing a wireless communication signal is provided. The apparatus includes a first receiving and demodulating circuit, a second receiving and demodulating circuit, and a selecting device. The first receiving and demodulating circuit is implemented for receiving the wireless communication signal and demodulating the received wireless communication signal to generate a first transport stream based on a first spectrum direction. The second receiving and demodulating circuit is implemented for receiving the wireless communication signal and demodulating the received wireless communication signal to generate a second transport stream based on a second spectrum direction different from the first spectrum direction. At least one of the first receiving and demodulating circuit and the second receiving and demodulating circuit comprises a spectrum direction verifying device configured to verify a spectrum direction of the received wireless communication signal. The selecting device is coupled to the first receiving and demodulating circuit and the second receiving and demodulating circuit, and is configured for selectively outputting the first transport stream or the second transport stream according to the spectrum direction of the wireless communication signal verified by the spectrum direction verifying device.

According to another aspect of the present invention, an apparatus of processing a wireless communication signal is provided. The apparatus includes: a receiving block for receiving the wireless communication signal and generating a down-converted signal according to the received wireless communication signal; a signal mode detector for detecting a signal mode of the received wireless communication signal; and a demodulating block coupled to the receiving block for demodulating the down-converted signal to generate a transport stream. The demodulating block comprises a plurality of spectrum direction verifying devices, and the demodulating block refers to the signal mode of the wireless communication signal detected by the signal mode detector for selecting one of the spectrum direction verifying devices to verify a spectrum direction of the received wireless communication signal.

According to another aspect of the present invention, a method of processing a TDS-OFDM signal is provided. The method includes: receiving the TDS-OFDM signal and generating a down-converted signal according to the received TDS-OFDM signal; and demodulating the down-converted signal to generate a transport stream, which comprises performing a TPS decoding operation to generate a TPS decoding result; and verifying a spectrum direction of the received TDS-OFDM signal according to the TPS decoding result.

According to another aspect of the present invention, a method of processing a wireless communication signal is provided. The method includes: receiving the wireless communication signal and generating a down-converted signal according to the received wireless communication signal; detecting a signal mode of the received wireless communication signal; and demodulating the down-converted signal to generate a transport stream, which comprises referring to the signal mode of the received wireless communication signal for selecting one of a plurality of spectrum direction verifying schemes to verify a spectrum direction of the received wireless communication signal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 shows one part of a mapping table for system information.

FIG. 5 shows the other part of the mapping table for system information.

DETAILED DESCRIPTION

Figure 1:
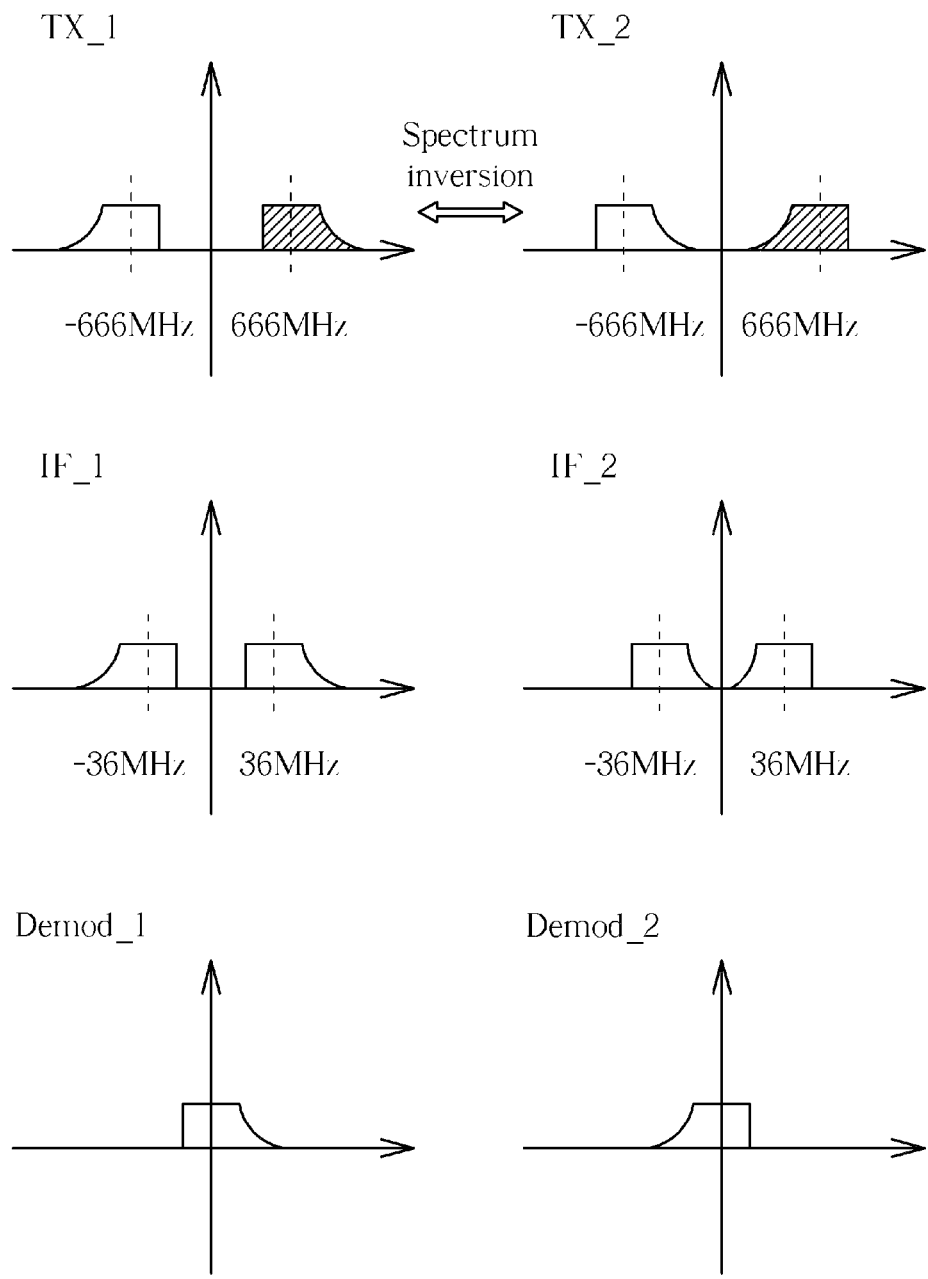
FIG. 1 is a spectrum diagram illustrating characteristics of the spectrum inversion.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

In accordance with exemplary embodiments of the present invention, a novel approach for dealing with the spectrum inversion is proposed. The exemplary approach of the present invention detects a signal mode of a wireless communication signal, and then refers to the signal mode of the wireless communication signal for selecting one of a plurality of available spectrum direction verifying schemes to verify a spectrum direction of the received wireless communication signal. For example, when the signal mode of the wireless communication signal is a time domain synchronous orthogonal frequency division multiplexing (TDS-OFDM) mode, the transmission parameter signaling (TPS) decoding operation or the low-density parity check (LDPC) decoding operation is selected to verify the spectrum direction of the received wireless communication signal for detecting if spectrum inversion occurs; when the signal mode of the wireless communication signal is a non-Nordstrom-Robinson-coded (non-NR-coded) single carrier mode, the LDPC decoding operation is selected to verify the spectrum direction of the received wireless communication signal for detecting if spectrum inversion occurs; and when the signal mode of the wireless communication signal is an NR-coded single carrier mode, the NR decoding operation is selected to verify the spectrum direction of the received wireless communication signal for detecting if spectrum inversion occurs.

When the TPS decoding operation detects the spectrum inversion, the frequency setting of the local oscillation signal can be adjusted, the real part and the imaginary part of an input transmitted to a filter/synchronization circuit can be swapped, the sign of the real part of the input transmitted to the filter/synchronization circuit can be inverse, the sign of the imaginary part of the input transmitted to the filter/synchronization circuit can be inverse, or at least one of the real part and the imaginary part of inputs transmitted to a fast Fourier transform (FFT) device can be adjusted (e.g., the real part and the imaginary part of the transmitted data are swapped, and the sign of the imaginary part of the channel estimation result is inverted to make the channel estimation result become a complex conjugate which is then received by the FFT device) to make the receiver obtain the correct data intended to be transmitted by the transmitter end. When the LDPC decoding operation detects the spectrum inversion, at least one of the real part and the imaginary part of inputs to be fed into an FFT device can be adjusted, the real part and the imaginary part of an input of a demapping device, or the real part and the imaginary part of an output of the time-domain deinterleaving device can be swapped to make the receiver obtain the correct data intended to be transmitted by the transmitter end. When the NR decoding operation detects the spectrum inversion, the real part and the imaginary part of an input of an NR decoder can be swapped to make the receiver obtain the correct data intended to be transmitted by the transmitter end.

For clarity, these exemplary solutions directed to dealing with the problem caused by the spectrum inversion are illustrated as follows. Suppose that the signal S'(t) transmitted from the transmitter end has the following form: $S'(t)=A(t)\cos(\omega_0 t)-B(t)\sin(\omega_0 t)$, where A(t) and B(t) are real part and imaginary part of the data intended to be transmitted, and $\omega_0$ is the carrier frequency. When a mixer is implemented to down-convert the transmitted signal S'(t) into an IF signal using a local oscillation signal $LO=\cos((\omega_0+\omega_I)t)$, where $\omega_I$ is the intermediate frequency, the down conversion can be expressed using following equation:

$$\cos((\omega_0 + \omega_I)t) \times [A(t)\cos(\omega_0 t) - B(t)\sin(\omega_0 t)] = \quad (1)$$
$$A(t)\cos((\omega_0 + \omega_I)t)\cos(\omega_0 t) - B(t)\cos((\omega_0 + \omega_I)t)\sin(\omega_0 t) =$$
$$\frac{1}{2}A(t)[\cos((2\omega_0 + \omega_I)t) + \cos(\omega_I t)] -$$
$$\frac{1}{2}B(t)[\sin((2\omega_0 + \omega_I)t) - \sin(\omega_I t)] = \frac{1}{2}\{A(t)\cos(\omega_I t) +$$
$$B(t)\sin(\omega_I t) + [A(t)\cos((2\omega_0 + \omega_I)t) - B(t)\sin((2\omega_0 + \omega_I)t)]\}$$

The high-frequency component $A(t)\cos((2\omega_0+\omega_I)t)$ and $$-\frac{1}{2}B(t)\sin((2\omega_0 + \omega_I)t)$$

will be filtered out, for example, by a surface acoustic wave (SAW) filter, and an automatic gain control (AGC) will be implemented to cancel the coefficient ½. Therefore, an IF signal $A(t)\cos(\omega_I t)+B(t)\sin(\omega_I t)$ is derived.

Due to the spectrum inversion, the real part and the imaginary part of the derived IF signal $A(t)\cos(\omega_I t)+B(t)\sin(\omega_I t)$ are A(t) and B(t), respectively. As one can see, the imaginary part B(t) is different from the imaginary part −B(t) of the transmitted signal $A(t)\cos(\omega_0 t)-B(t)\sin(\omega_0 t)$. A first solution for dealing with the spectrum inversion is to invert the sign of the imaginary part in the receiver end. As a result, the finally derived real part and the imaginary part of the derived IF signal $A(t)\cos(\omega_I t)+B(t)\sin(\omega_I t)$ become the desired A(t) and −B(t), respectively.

A second solution is to invert the sign of the real part. Therefore, the adjusted IF signal can be expressed as follows:

$$-A(t)\cos(\omega_I t)+B(t)\sin(\omega_I t)=-[A(t)\cos(\omega_I t)-(B(t))\sin(\omega_I t)] \quad (2)$$

The negative sign −1 will be cancelled through a following signal processing stage in the receiver end. For example, a synchronization circuit will make the real part −A(t) and the imaginary part B(t) become the desired A(t) and −B(t), respectively.

A third solution is to swap the real part and the imaginary part. Suppose that the desired signal to be received should be of the complex form: A(t)+jB(t), where $j=\sqrt{-1}$. However, the actually-received signal has the complex form: A(t)+j(−B(t)). Therefore, after the real part and the imaginary part are swapped, the result can be expressed as follows:

$$-B(t)+jA(t)=j[A(t)+jB(t)] \quad (3)$$

In above equation (3), the imaginary unit j can be cancelled by a following signal processing stage in the receiver end, thereby obtaining the desired result A(t)+jB(t).

A fourth solution is to change the intermediate frequency used in the down conversion. For example, to derive DC components (i.e., the real part and the imaginary part) from the IF signal $A(t)\cos(\omega_I t)+B(t)\sin(\omega_I t)$, the IF signal $A(t)\cos(\omega_I t)+B(t)\sin(\omega_I t)$ is further down-converted using local oscillation signals with the intermediate frequency $\omega_I$. The operation can be expressed using following equations:

$$[A(t)\cos(\omega_I t) + B(t)\sin(\omega_I t)]\cos\omega_I t = \quad (4)$$
$$A(t)\cos^2(\omega_I t) + B(t)\sin(\omega_I t)\cos(\omega_I t) =$$
$$\frac{1}{2}\{A(t) + [A(t)\cos(2\omega_I t) + B(t)\sin(2\omega_I t)]\}$$

-continued $$[A(t)\cos(\omega_I t) + B(t)\sin(\omega_I t)]\sin\omega_I t = \quad (5)$$
$$A(t)\cos(\omega_I t)\sin(\omega_I t) + B(t)\sin^2(\omega_I t) =$$
$$\frac{1}{2}\{B(t) + [A(t)\sin(2\omega_I t) - B(t)\cos(2\omega_I t)]\}$$

Similarly, the high-frequency component $[A(t)\cos(2\omega_I t)+B(t)\sin(2\omega_I t)]$ and $[A(t)\sin(2\omega_I t)-B(t)\cos(2\omega_I t)]$ will be filtered out, and the coefficient ½ will be cancelled by AGC to therefore derive the real part A(t) and imaginary part B(t). To obtain the desired real part A(t) and imaginary part −B(t), the intermediate frequency is changed from $\omega_I$ to $-\omega_I$. The operation of deriving the desired real part A(t) and imaginary part −B(t) in baseband can be expressed using following equations:

$$[A(t)\cos(\omega_I t) + B(t)\sin(\omega_I t)]\cos(-\omega_I t) = \quad (6)$$
$$A(t)\cos^2(\omega_I t) + B(t)\sin(\omega_I t)\cos(-\omega_I t) =$$
$$\frac{1}{2}\{A(t) + [A(t)\cos(2\omega_I t) + B(t)\sin(2\omega_I t)]\}$$

$$[A(t)\cos(\omega_I t) + B(t)\sin(\omega_I t)]\sin(-\omega_I t) = \quad (7)$$
$$-A(t)\cos(\omega_I t)\sin(\omega_I t) - B(t)\sin^2(\omega_I t) =$$
$$\frac{1}{2}\{(-B(t)) - [A(t)\sin(2\omega_I t) - B(t)\cos(2\omega_I t)]\}$$

In an alternative design, the fourth solution can be applied to the intermediate frequency used for down-converting the RF signal into the IF signal. That is, the frequency of the local oscillation signal is changed from $\omega_0+\omega_I$ is changed to $\omega_0-\omega_I$. As a person skilled in the art would readily understand such an equivalent operation after reading above paragraphs, further description is omitted here for brevity.

To more clearly illustrate the conception of the present invention, further description is detailed using following exemplary embodiments.

Figure 2:
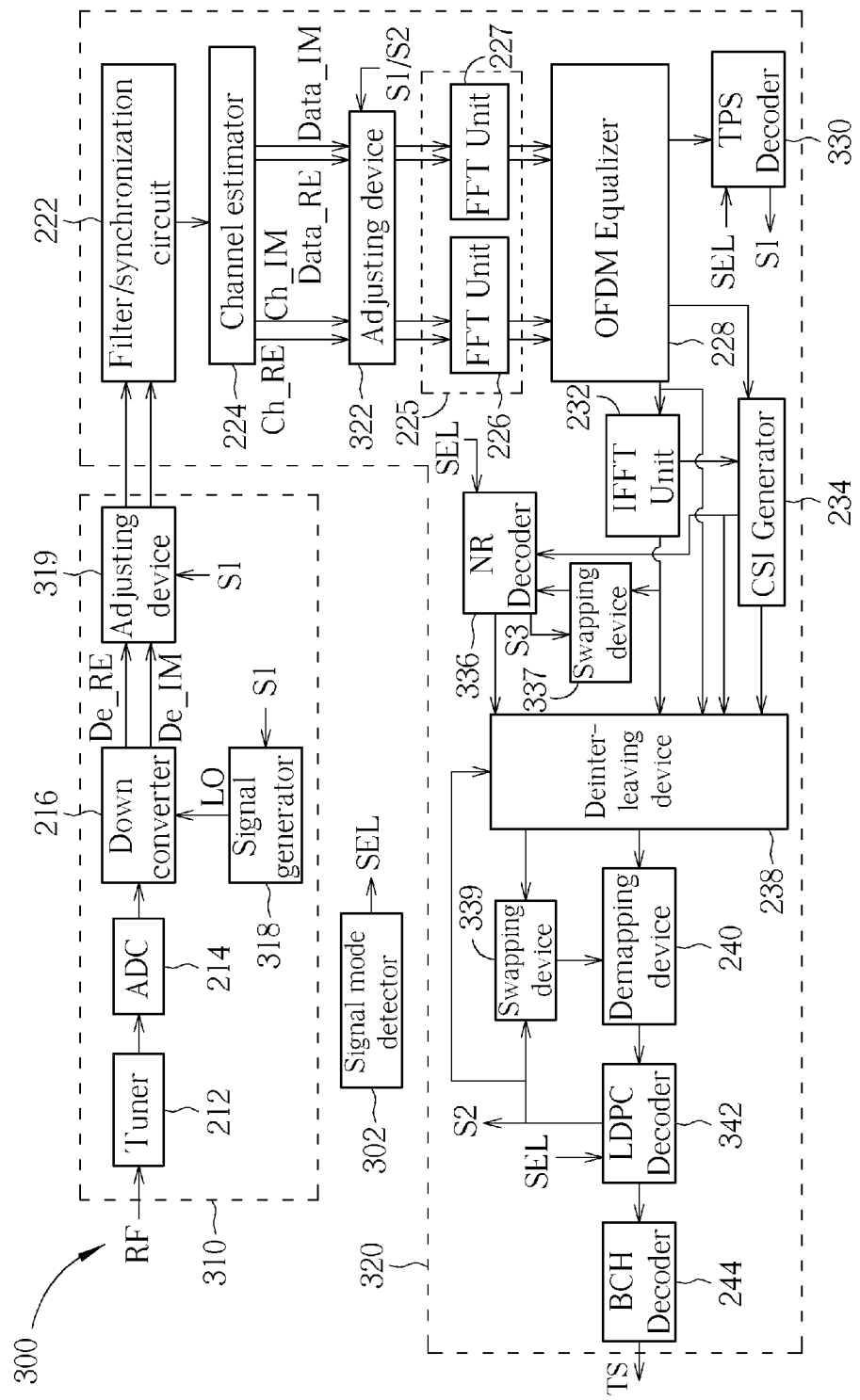
FIG. 2 is a block diagram illustrating one exemplary embodiment of an apparatus for processing a wireless communication signal according to the present invention.

FIG. 2 is a block diagram illustrating one exemplary embodiment of an apparatus for processing a wireless communication signal according to the present invention. In this embodiment, the apparatus for processing a wireless communication signal is a DTMB receiver 300 for processing a wireless communication signal RF complying with a DTMB standard. The exemplary DTMB receiver 300 includes, but is not limited to, a signal mode detector 302, a receiving block 310 configured for receiving the wireless communication signal RF and processing the received wireless communication signal RF to generate a down-converted signal, and a demodulating block 320 configured for demodulating the down-converted signal generated from the preceding receiving block 310 to generate a transport stream TS. As shown in FIG. 2, the receiving block 310 includes a tuner 212, an analog-to-digital converter (ADC) 214, a down converter 216 for generating the down-converted signal including a real part De_RE and an imaginary part De_IM, a signal generator 318, and an adjusting device 319. The demodulating block 320 includes a filter/synchronization circuit 222, a channel estimator 224 configured for generating a real part Ch_RE and an imaginary part Ch_IM of the channel estimation result and a real part Data_RE and an imaginary part Data_IM of the transmitted data, an adjusting device 322, a plurality of swapping devices 337, 339, an FFT device 225 including a plurality of FFT units 226 and 227, an orthogonal frequency-division-multiplexing (OFDM) equalizer 228, a transmission parameter signaling (TPS) decoder 330, an inverse FFT (IFFT) unit 232, a channel state information (CSI) generator 234, an Nordstrom-Robinson (NR) decoder 336, a deinterleaving device 238, a demapping device 240, an low-density parity check (LDPC) decoder 342, and a Bose-Chaudhuri-Hocquenghem (BCH) decoder 244.

General configurations of the DTMB receiver 300 are briefly summarized as follows. When the wireless communication signal received by the DTMB receiver 300 is a time domain synchronous orthogonal frequency-division-multiplexing (TDS-OFDM) signal, the OFDM equalizer output is directly delivered to the following signal processing stage, i.e., the deinterleaving device 238; in addition, the OFDM equalizer output is processed by the CSI generator 234 to generate channel state information to the deinterleaving device 238. It should be noted that the deinterleaving device 238 is implemented for performing time-domain deinterleaving, and under the TDS-OFDM mode, the FFT device 225 performs a combination of fast Fourier transform and frequency-domain deinterleaving. The deinterleaved signal generated from the deinterleaving device 238 is processed by the demapping device 240, the LDPC decoder 342, and the BCH decoder 244 in order.

When the wireless communication signal received by the DTMB receiver 300 is a non-NR-coded single carrier signal (e.g., the transmitted wireless communication signal is not generated using a 4QAM_NR modulation), the OFDM equalizer output is first processed by the IFFT unit 232 to generate a single carrier data, and then the IFFT output is delivered to the following signal processing stage, i.e., the deinterleaving device 238; in addition, the IFFT output is processed by the CSI generator 234 to generate channel state information to the deinterleaving device 238. Next, the deinterleaved signal generated from the deinterleaving device 238 is processed by the demapping device 240, the LDPC decoder 342, and the BCH decoder 244 in order.

When the wireless communication signal received by the DTMB receiver 200 is an NR-coded single carrier signal (e.g., the transmitted wireless communication signal is generated using a 4QAM_NR modulation), the OFDM equalizer output is first processed by the IFFT unit 232, and then the IFFT output is processed by the NR decoder 336; in addition, the IFFT output is processed by the CSI generator 234, and then an output of the CSI generator 234 is provided to the NR decoder 336. A decoding output of the NR decoder 336 is delivered to the following signal processing stage, i.e., the deinterleaving device 238. The deinterleaved signal generated from the deinterleaving device 238 is processed by the demapping device 240, the LDPC decoder 342, and the BCH decoder 244 in order.

In the receiver architecture shown in FIG. 2, the signal mode detector 302 is implemented to detect a signal mode of the received wireless communication signal RF, and generate a selection signal SEL to the LDPC decoder 342, the TPS decoder 330, and the NR decoder 336 (which also serve as spectrum direction verifying devices in this exemplary embodiment) according to the detected signal mode of the wireless communication signal RF to thereby select one of a plurality of spectrum direction verifying schemes, respectively supported by the LDPC decoder 342, the TPS decoder 330, and the NR decoder 336, to verify a spectrum direction of the received wireless communication signal RF. For example, the signal mode detector 302 can identify the signal mode through a try and error mechanism, referencing information carried via the wireless communication signal RF (e.g., the carrier mode information transmitted via TPS), or using a threshold-to-average power ratio (TAPR). However, this is for illustrative purpose only, and is not meant to be a limitation of the present invention. That is, using other detection approach to identify the signal mode is feasible.

In addition, the TPS decoder 330 is configured to output a control signal S1 to one of the signal generator 318 and the adjusting devices 319 and 322 when the spectrum inversion is detected by the spectrum direction verifying scheme thereof; the LDPC decoder 342 is configured to output a control signal S2 to one of the adjusting device 322, the swapping device 339 and the deinterleaving device 238 when the spectrum inversion is detected by the spectrum direction verifying scheme thereof; and the NR decoder 336 outputs a control signal S3 to the swapping device 337 when the spectrum inversion is detected by the spectrum direction verifying scheme thereof.

For clear understanding of technical features of the present invention, several exemplary operational scenarios of the DTMB receiver 300 shown in FIG. 2 are illustrated as follows.

Figure 3:
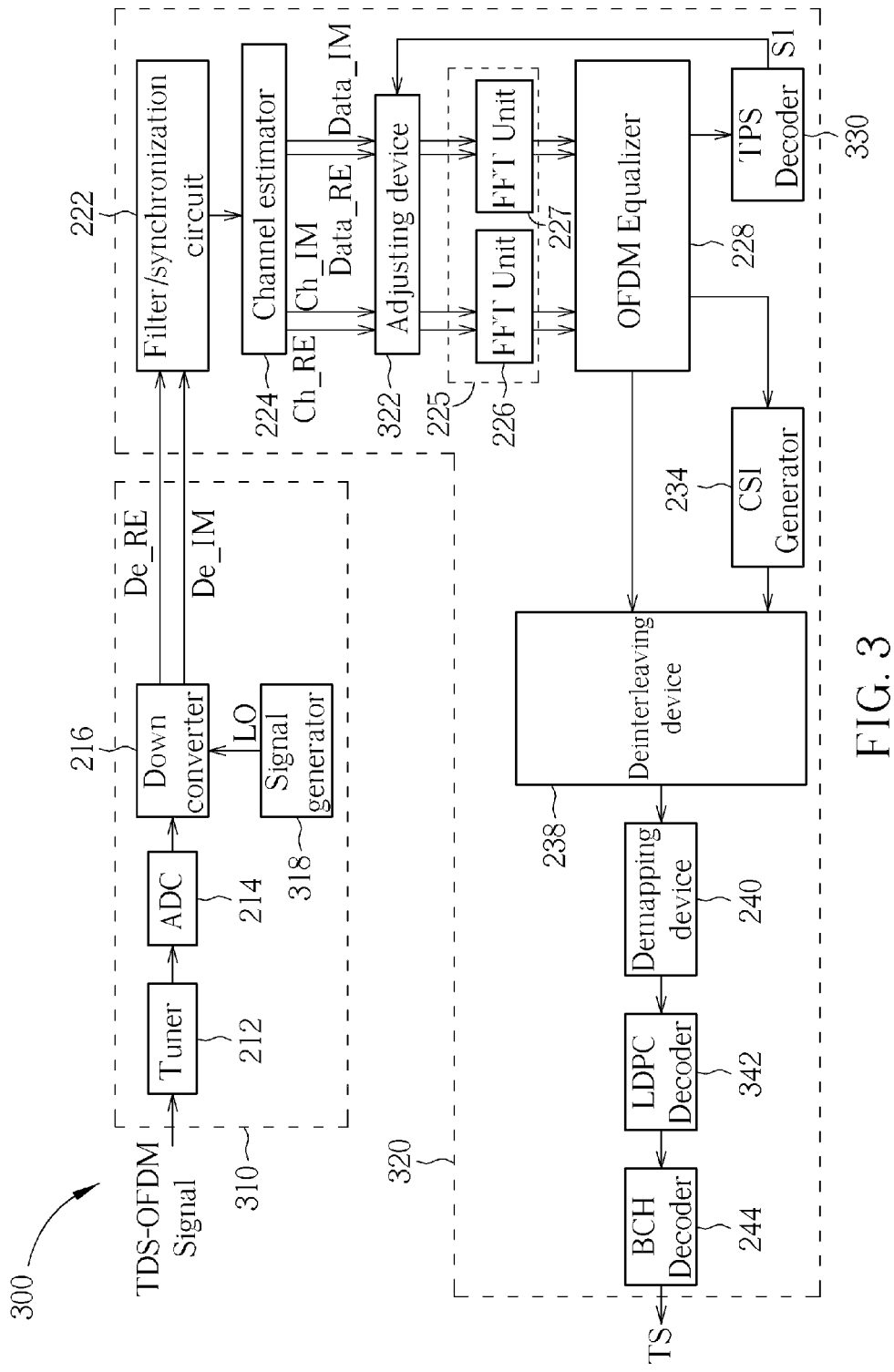
FIG. 3 is a diagram illustrating a first operational scenario of the DTMB receiver shown in FIG. 2.

FIG. 3 is a diagram illustrating a first operational scenario of the DTMB receiver 300 shown in FIG. 2. Please note that only the components pertinent to illustrating this operational scenario are shown in FIG. 3 for simplicity and clarity. For example, the adjusting device 319 which bypasses the incoming signal to the following filter/synchronization circuit 222, the swapping device 339 which bypasses the incoming signal to the following demapping device 240, and components associated with the single carrier signal processing, such as the IFFT unit 232, the NR decoder 336, and the swapping device 337, are not shown in FIG. 3. In this case, the signal mode detector 302 identifies that the signal mode of the received wireless communication signal RF is a TDS-OFDM mode (i.e., the wireless communication signal RF is a TDS-OFDM signal), and the spectrum direction verifying scheme supported by the TPS decoder 330 is therefore selected and enabled. In addition, the TPS decoder 330 outputs the control signal S1 to the adjusting device 322 when the spectrum inversion is detected by the spectrum direction verifying scheme thereof. As the TPS includes system information transmitted via a codeword, the spectrum direction verifying scheme therefore uses the coding characteristics of the TPS to verify the spectrum direction. As known to those skilled in the art, the TPS is used for providing system configuration information. Specifically, the TPS includes 36 bits, in which 4 bits are used to serve as a carrier mode indication, and remaining 32 bits, forming a codeword, are used for providing system information, such as demodulation and decoding information, for each signal frame. For example, the 4-bit carrier mode indication is set by repetition of 0's (i.e., "0000") when the carrier mode is a single-carrier mode (C=1), while the 4-bit carrier mode indication is set by repetition of 1's (i.e., "1111") when the carrier mode is an OFDM mode (C=3780). The 32-bit codeword is generated from processing 6 information bits through a Walsh code mapping and then a 32-bit pseudo-random (PN) sequence. For example, the 32-bit codeword can transmit information of modulation/constellation mode, LDPC code rate, interleaving mode, etc. The length of each 32-bit codeword is 32; however, the total number of all possible codewords is 64 ($2^6$) rather than $2^{32}$, as illustrated in FIG. 4 and FIG. 5 which show a mapping table for the system information.

Figure 6:
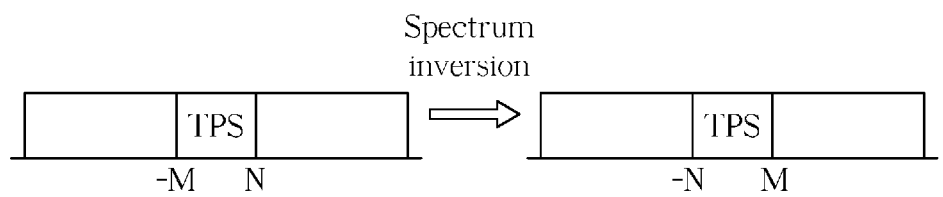
FIG. 6 is a spectrum diagram of a signal frame.

The TPS decoder 330 performs a TPS decoding operation to generate a TPS decoding result, and then verifies the spectrum direction of the TDS-OFDM signal according to the TPS decoding result. For example, the TPS decoder 330 decodes the TPS information transmitted by the currently received TDS-OFDM signal to derive a 32-bit codeword transmitted by the TPS, and then refers to the derived 32-bit codeword to see if the spectrum inversion occurs. In one implementation, the TPS decoder 330 finds one of the possible codewords listed in the mapping table shown in FIG. 4 and FIG. 5 that is most similar or identical to the derived 32-bit codeword (i.e., identifies a decoded codeword corresponding to a first spectrum direction), and then remaps the derived 32-bit codeword to obtain a remapped codeword and finds one of the possible codewords listed in the mapping table shown in FIG. 4 and FIG. 5 that is most similar or identical to the remapped codeword (i.e., identifies a decoded codeword corresponding to a second spectrum direction opposite to the first spectrum direction). Next, the TPS decoder 330 determines which one of the decoded codewords is most likely the true 32-bit codeword transmitted from the transmitter end. Please refer to FIG. 6, which shows a spectrum diagram of a signal frame. When the transmitter end transmits the signal frame with a correct spectrum direction, the TPS will be transmitted using 36 subcarriers indexed, for example, from −M to N. However, in a case where the transmitter end transmits the signal frame with an inverse spectrum direction, the location of the bits included in the TPS will be changed. For example, the TPS is therefore transmitted using 36 subcarriers indexed from −N to M instead. That is, the system information, including modulation/constellation mode, LDPC code rate, interleaving mode, etc., is stilled transmitted by a 32-bit codeword; however, the bit locations are different. When the decoded codeword selected from the mapping table shown in FIG. 4 and FIG. 5 according to the derived 32-bit codeword is judged to be the true codeword carrying system information intended to be transmitted by the transmitter end, the TPS decoder 330 determines that no spectrum inversion occurs; on the contrary, when the decoded codeword selected from the mapping table shown in FIG. 4 and FIG. 5 according to the remapped 32-bit codeword is judged to be the true codeword carrying system information intended to be transmitted by the transmitter end, the TPS decoder 330 determines that the spectrum inversion occurs.

For clarity, the above operation can be briefly summarized as follows. The 32-bit codeword derived from the currently received TDS-OFDM signal includes 32 bits each expressed as $R_m$ (m=1–32). For each codeword listed in the mapping table shown in FIG. 4 and FIG. 5, a computational result $L_n$ corresponding to the $n^{th}$ codeword is derived using following equation:

$$L_n = \sum_{m=1}^{32} C_n(m) \cdot r_m \qquad (8)$$

In above equation (8), $r_m$ is a summation result of a real part and an imaginary part of $R_m$, i.e., $r_m = \text{Re}(R_m) + \text{Im}(R_m)$; besides, $C_n(m)$ is either +1 or −1, depending on the logic value of the $m^{th}$ bit of the $n^{th}$ codeword. In one exemplary implementation, $C_n(m)$ is assigned by −1 when the $m^{th}$ bit of the $n^{th}$ codeword is 0, and $C_n(m)$ is assigned by +1 when the $m^{th}$ bit of the $n^{th}$ codeword is 1. The TPS decoder 330 therefore obtains 64 computational results $L_1$-$L_{64}$.

As mentioned above, the bit order of the TPS will be changed when the spectrum inversion occurs. The TPS decoder 330 therefore remaps the derived 32-bit codeword to derive a remapped codeword including 32 bits each expressed as $R'_m$ (m=1–32). For each codeword listed in the mapping table shown in FIG. 4 and FIG. 5, a computational result $L'_n$ corresponding to the $n^{th}$ codeword is derived using following equation:

$$L'_n = \sum_{m=1}^{32} C_n(m) \cdot r'_m \qquad (9)$$

In above equation (9), $r'_m$ is the summation result of a real part and an imaginary part of $R'_m$, i.e., $r'_m = Re(R'_m) + Im(R'_m)$. The TPS decoder 330 therefore obtains 64 computational results $L'_1$-$L'_{64}$.

To detect the occurrence of spectrum inversion, the TPS decoder 330 identifies a maximum value from the computational results $L_1$-$L_{64}$ and $L'_1$-$L'_{64}$. When the maximum value is selected from the computational results $L_1$-$L_{64}$, meaning that the maximum of the computational results $L_1$-$L_{64}$ is greater than the maximum of the computational results $L'_1$-$L'_{64}$, the TPS decoder 330 determines that no spectrum inversion occurs; on the contrary, when the maximum value is selected from the computational results $L'_1$-$L'_{64}$, meaning that the maximum of the computational results $L'_1$-$L'_{64}$ is greater than the maximum of the computational results $L_1$-$L_{64}$, the TPS decoder 330 determines that the spectrum inversion occurs.

As mentioned above, the computational results $L'_1$-$L'_{64}$ are derived using $C_n(m)$ and $r'_m$, where n=1-64 and m=1-32. However, the same computational results $L'_1$-$L'_{64}$ can be derived using $C'_n(m)$ and $r_m$, where n=1-64 and m=1-32. In this alternative design, the TPS decoder 330 remaps each codewords listed in the mapping table shown in FIG. 4 and FIG. 5 instead of the derived 32-bit codeword, and then obtains the above-mentioned $C'_n(m)$ for each remapped codeword. A computational result $L'_n$ corresponding to the $n^{th}$ remapped codeword is therefore derived using following equation:

$$L'_n = \sum_{m=1}^{32} C'_n(m) \cdot r_m \qquad (10)$$

When the TPS decoder 330 shown in FIG. 3 detects the occurrence of the spectrum inversion, the TPS decoder 330 generates the control signal S1 to activate the adjusting device 322 to adjust at least one of a real part and an imaginary part of inputs actually received by the FFT device 225, wherein the inputs include, but are not limited to, the transmitted data and the channel estimation result. For example, in one exemplary implementation, the adjusting device 322 simply swaps the real part and the imaginary part of a data part (i.e., the transmitted data) transmitted to the FFT unit 227 included in the FFT device 225, and outputs a complex conjugate of a channel part (i.e., the channel estimation result) to the FFT unit 226 included in the FFT device 225. More specifically, when the spectrum inversion is detected using the TPS decoding result as proposed by the present invention, the real part of the channel estimation result transmitted to the FFT unit 226 is the originally received real part Ch_RE (i.e., the original real part Ch_RE is bypassed to the FFT unit 226), and the imaginary part of the channel estimation result transmitted to the FFT unit 226 is set by inverting the sign of the originally received imaginary part Ch_IM (i.e., (−1)*Ch_IM becomes the imaginary part passed to the FFT unit 226); in addition, the real part Data_RE becomes an imaginary part inputted to the FFT unit 227, and the imaginary part Data_IM becomes a real part inputted to the FFT unit 227. However, if the channel estimation result fed into the FFT unit 226 and the transmitted data fed into the FFT unit 227 are further multiplied with a common constant C, the common constant C will be cancelled by the OFDM equalizer 228 without affecting the actual OFDM equalizer output because of the inherent data manipulation performed by the OFDM equalizer 228. Therefore, the generalized output of the adjusting device 322 can be expressed using following equations:

$$\text{Out\_Data\_RE} + j*\text{Out\_Data\_IM} = C*(\text{Data\_IM} + j*\text{Data\_RE}) \qquad (11)$$

$$\text{Out\_Ch\_RE} + j*\text{Out\_Ch\_IM} = C*(Ch\_RE + j* (-1)*Ch\_IM) \qquad (12)$$

In above equations (11) and (12), Out_Data_RE and Out_Data_IM represent the real part and the imaginary part of the transmitted data actually received by the FFT unit 227, respectively; and Out_Ch_RE and Out_Ch_IM represents the real part and the imaginary part of the channel estimation result actually received by the FFT unit 226, respectively. By way of example, and not as a limitation, the common constant C can be simply implemented using +1, −1, +j, or −j. In a first case where C=+1, the operation of the adjusting device 322 is identical to that mentioned above. That is, Out_Data_RE=Data_IM, Out_Data_IM=Data_RE, Out_Ch_RE=Ch_RE, and Out_Ch_IM=(−1)*Ch_IM. In a second case where C=−1, the operation of the adjusting device 322 is equivalent to setting the real part of the channel estimation result generated from the channel estimator 224 by inverting the sign of the originally received real part Ch_RE (i.e., Out_Ch_RE=(−1)*Ch_RE), setting the imaginary part of the channel estimation result generated from the channel estimator 224 by the originally received imaginary part Ch_IM (i.e., Out_Ch_IM=Ch_IM), setting the real part of the transmitted data generated from the channel estimator 224 by inverting the sign of the originally received imaginary part Data_IM (i.e., Out_Data_RE=(−1)*Data_IM), and setting the imaginary part of the transmitted data generated from the channel estimator 224 by inverting the sign of the originally received real part Data_RE (i.e., Out_Data_IM=(−1)*Data_RE).

In a third case where C=+j, the operation of the adjusting device 322 is equivalent to setting the real part of the channel estimation result generated from the channel estimator 224 by the originally received imaginary part Ch_IM (i.e., Out_Ch_RE=Ch_IM), setting the imaginary part of the channel estimation result generated from the channel estimator 224 by the originally received real part Ch_RE (i.e., Out_Ch_IM=Ch_RE), setting the real part of the transmitted data generated from the channel estimator 224 by inverting the sign of the originally received real part Data_RE (i.e., Out_Data_RE=(−1)*Data_RE), and setting the imaginary part of the transmitted data generated from the channel estimator 224 by the originally received imaginary part Data_IM (i.e., Out_Data_IM=Data_IM).

In a fourth case where C=−j, the operation of the adjusting device 322 is equivalent to setting the real part of the channel estimation result generated from the channel estimator 224 by inverting the sign of the originally received imaginary part Ch_IM (i.e., Out_Ch_RE=(−1)*Ch_IM), setting the imaginary part of the channel estimation result generated from the channel estimator 224 by inverting the sign of the originally received real part Ch_RE (i.e., Out_Ch_IM=(−1)*Ch_RE), setting the real part of the transmitted data generated from the channel estimator 224 by the originally received real part Data_RE (i.e., Out_Data_RE=Data_RE), and setting the imaginary part of the transmitted data generated from the channel estimator 224 by inverting the sign of the originally received imaginary part Data_IM (i.e., Out_Data_IM=(−1) *Data_IM).

Please note that in an actual implementation, the above-mentioned common constant C can be a value other than +1, −1, +j, and −j. More specifically, the common constant C can be any value as long as the same common constant C is applied to both of the transmitted data and the channel estimation result.

As shown in FIG. 3, the spectrum direction detection is performed before the deinterleaving device 238 which requires much time on deinterleaving its input, therefore shortening the time required for checking the spectrum direction. In addition, the adjustment made to at least one of the real part DATA_RE and the imaginary part Data_IM of the transmitted data occurs after the filter/synchronization circuit 222. In this way, there is no need to re-do the channel synchronization and channel estimation which may take a lot of frames to re-converge to a good condition. As a result, the overall performance of the DTMB receiver is improved greatly.

Figure 7:
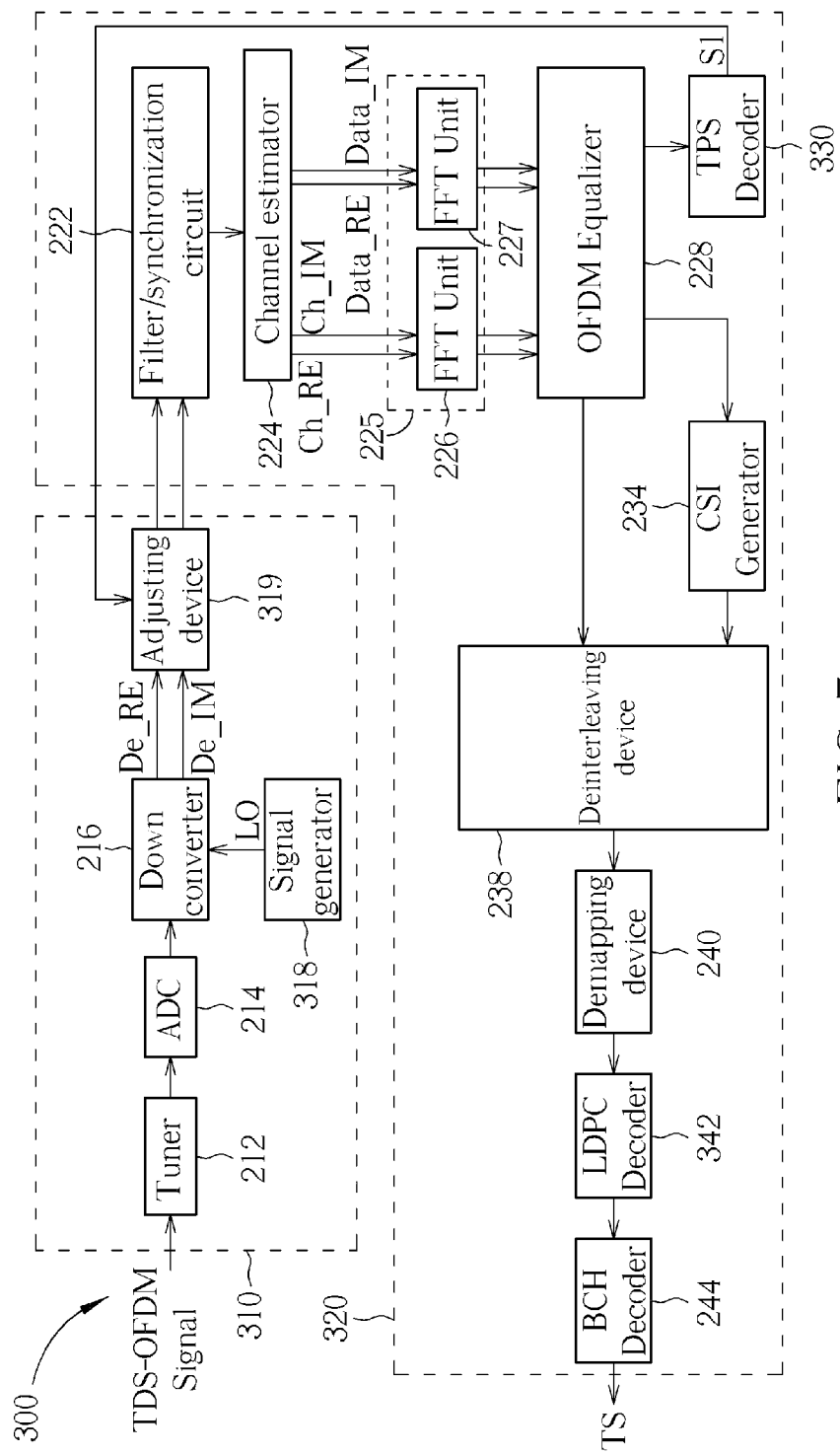
FIG. 7 is a diagram illustrating a second operational scenario of the DTMB receiver shown in FIG. 2.

The above merely serves as one preferred embodiment of using the TPS decoding result to verify the spectrum direction and then selectively making the receiver adapted to the correct spectrum direction for recovering the correct data transmitted from the transmitter end. Other alternative designs are possible. Specifically, any receiver apparatus which uses the TPS decoding result to examine the spectrum direction and then adaptively tunes the spectrum direction obeys the spirit of the present invention, and falls within the scope of the present invention. FIG. 7 is a diagram illustrating a second operational scenario of the DTMB receiver 300 shown in FIG. 2. Please note that only the components pertinent to illustrating this operational scenario are shown in FIG. 7 for simplicity and clarity. In this exemplary embodiment shown in FIG. 7, the signal mode detector 302 shown in FIG. 2 identifies that the signal mode of the wireless communication signal is a TDS-OFDM mode, and the spectrum direction verifying scheme supported by the TPS decoder 330 is selected and enabled. In addition, the TPS decoder 330 outputs the control signal S1 to the adjusting device 319 included in the receiving block 310 when the spectrum inversion is detected by the spectrum direction verifying scheme thereof. When the spectrum inversion is detected, the TPS decoder 330 generates the control signal S1 to enable the adjusting device 319 to swap the real part and the imaginary part of an input received by the filter/synchronization circuit 222, invert the sign of the real part of the input transmitted to the filter/synchronization circuit 222, or invert the sign of the imaginary part of the input transmitted to the filter/synchronization circuit 222, depending upon design requirements. For example, when the spectrum inversion is detected using the TPS decoding result, the real part De_RE and imaginary part De_IM of an incoming signal received by the adjusting device 319 respectively become an imaginary part and a real part transmitted to the filter/synchronization circuit 222; when the spectrum inversion is detected using the TPS decoding result, the real part De_RE of an incoming signal received by the adjusting device 319 remains intact, and the imaginary part De_IM of the incoming signal received by the adjusting device 319 becomes −1*De_IM; and when the spectrum inversion is detected using the TPS decoding result, the real part De_RE of an incoming signal received by the adjusting device 319 becomes −1*De_RE, and the imaginary part De_IM of the incoming signal received by the adjusting device 319 remains intact.

Figure 8:
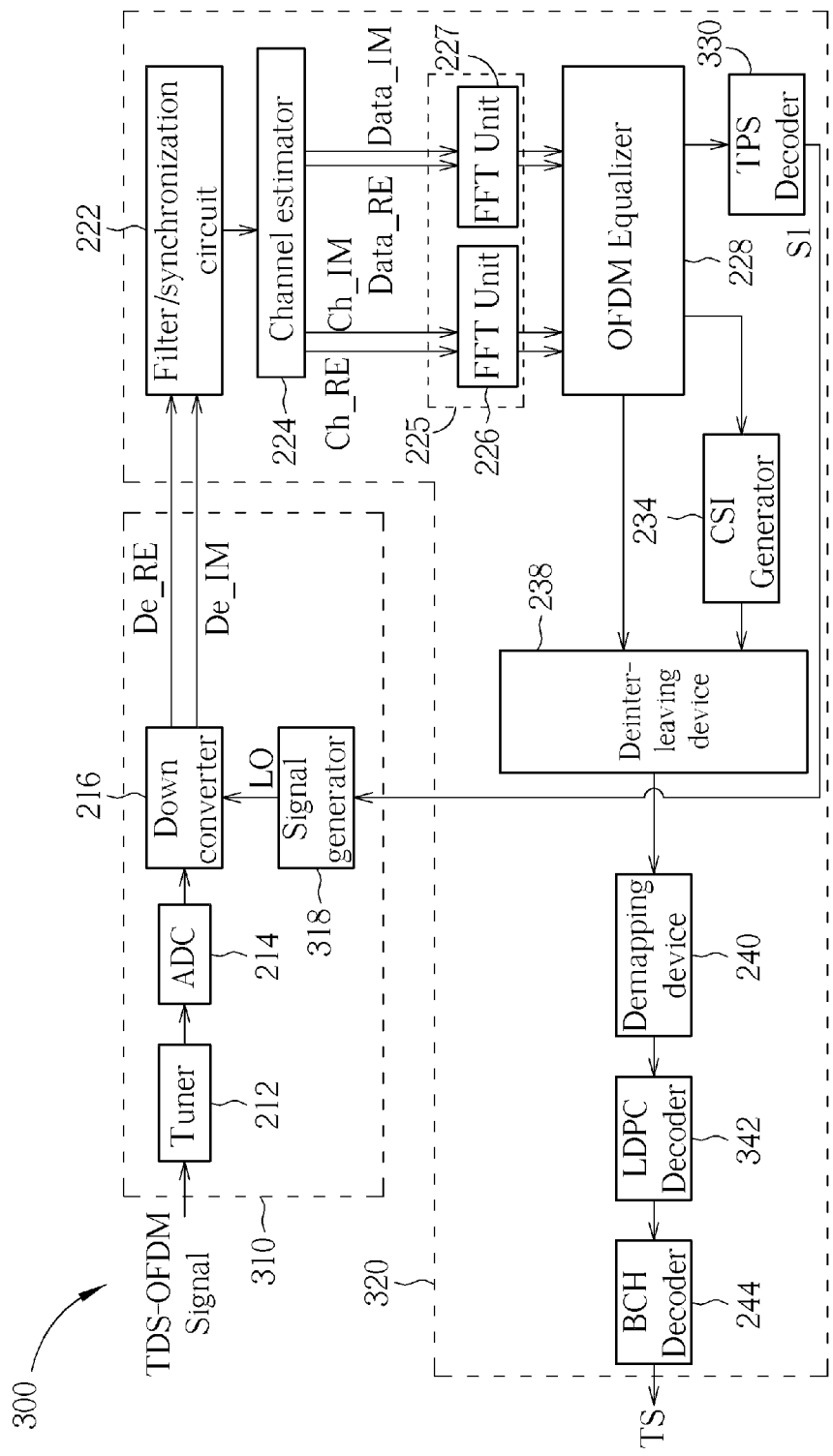
FIG. 8 is a diagram illustrating a third operational scenario of the DTMB receiver shown in FIG. 2.

FIG. 8 is a diagram illustrating a third operational scenario of the DTMB receiver 300 shown in FIG. 2. Similarly, only the components pertinent to illustrating this operational scenario are shown in FIG. 8. In this exemplary embodiment shown in FIG. 8, the signal mode detector 302 shown in FIG. 2 identifies that the signal mode of the wireless communication signal is a TDS-OFDM mode, and the spectrum direction verifying scheme supported by the TPS decoder 330 is selected and enabled. In addition, the TPS decoder 330 outputs the control signal S1 to the signal generator 318 included in the receiving block 310 when the spectrum inversion is detected by the spectrum direction verifying scheme thereof. That is, when the spectrum inversion is detected, the TPS decoder 330 generates the control signal S1 to notify the signal generator 318 to change the frequency of the local oscillation signal LO from a current frequency setting corresponding to a first spectrum direction to a new frequency setting corresponding to a second spectrum direction different from the first spectrum direction, thereby achieving the same objective of solving the problem caused by spectrum inversion. For example, when the spectrum inversion is detected using the TPS decoding result, the signal generator 318 notified by the control signal S1 changes the frequency of the local oscillation signal LO, used for converting an RF signal into an IF signal, from $w_0+\omega_I$ to $w_0-\omega_I$, or changes the frequency of the local oscillation signal LO, used for converting an IF signal into a baseband signal, from $w_I$ to $-w_I$. In this way, the direction of the spectrum of an incoming signal to be down-converted is selected by the down converter 216 correctly.

As shown in FIG. 7 and FIG. 8, the spectrum direction detection based on the TPS decoding result is performed before the deinterleaving device 238 which requires much time on deinterleaving its input, therefore shortening the time required for checking the spectrum direction. As a result, the overall performance of the DTMB receiver is improved using the aforementioned spectrum direction verifying scheme supported by the TPS decoder.

Figure 9:
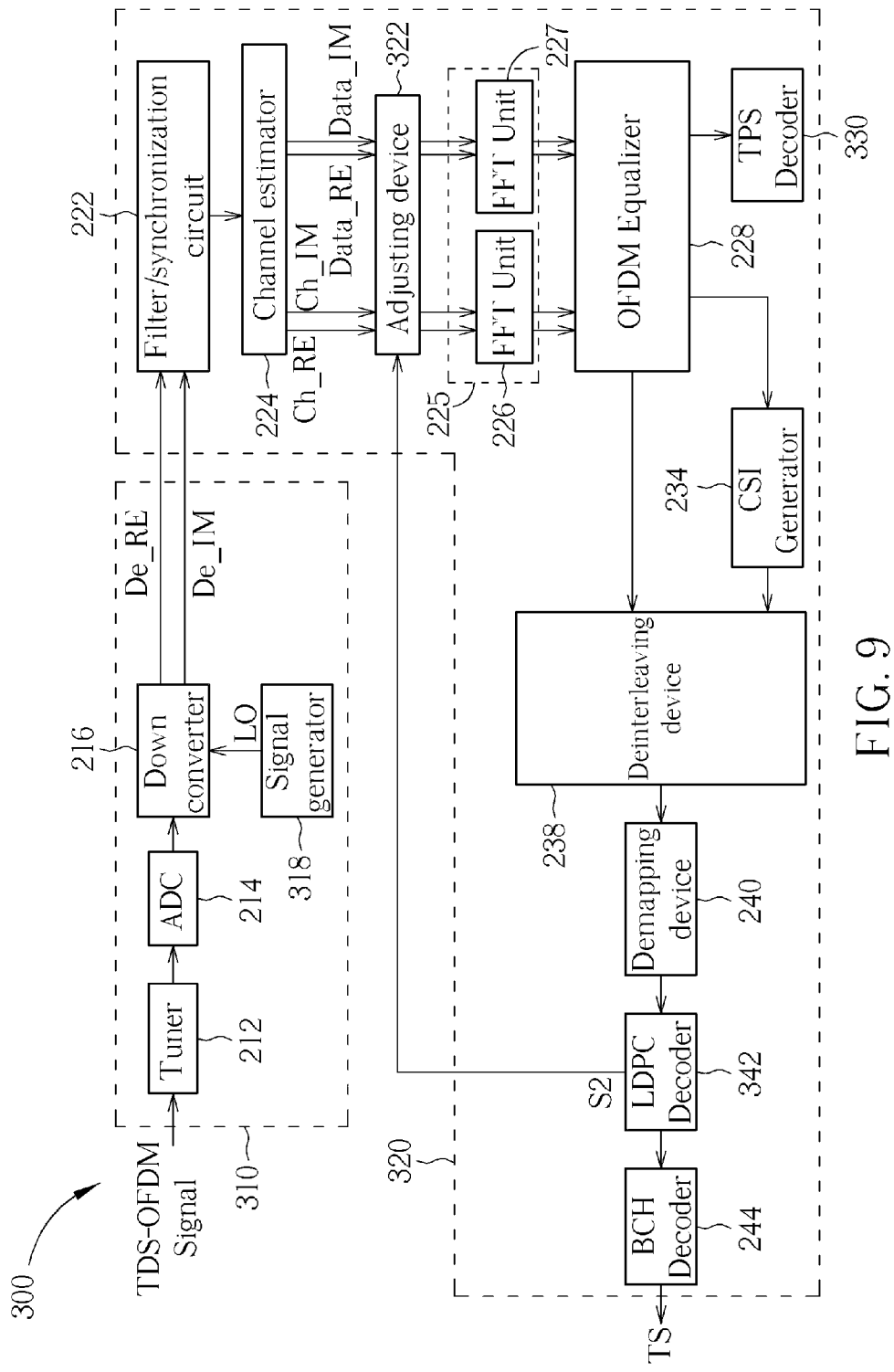
FIG. 9 is a diagram illustrating a fourth operational scenario of the DTMB receiver shown in FIG. 2.

FIG. 9 is a diagram illustrating a fourth operational scenario of the DTMB receiver 300 shown in FIG. 2. Please note that only the components pertinent to illustrating this operational scenario are shown in FIG. 9 for simplicity and clarity. In this case, the signal mode detector 302 shown in FIG. 2 identifies that the signal mode of the wireless communication signal is a TDS-OFDM mode, and the spectrum direction verifying scheme supported by the LDPC decoder 342 is selected and enabled. In addition, the LDPC decoder 342 outputs a control signal S2 to the adjusting device 322 when the spectrum inversion is detected by the spectrum direction verifying scheme thereof. That is, the LDPC decoder 342 performs an LDPC decoding operation to generate an LDPC decoding result (e.g., a parity check result) for each spectrum direction, and then verifies the spectrum direction of the TDS-OFDM signal according to the LDPC decoding results. When there are parity check errors found for a current spectrum direction and no parity check errors found for a spectrum direction opposite to the current spectrum direction for all of the LDPC codewords for a period of time, the LDPC decoder 342 deems that the spectrum inversion occurs. Therefore, the LDPC decoder 342 generates the control signal S2 to enable the adjusting device 322 to adjust at least one of the real part and the imaginary part of inputs actually received by the FFT device 225, wherein the inputs include, but are not limited to, the transmitted data and the channel estimation result. In this embodiment shown in FIG. 9, the adjusting device 322 is also configured to generate the output to the following FFT device 225 according to aforementioned equations (11) and (12). For example, provided that the common constant C is equal to 1, the real part Ch_RE becomes an imaginary part transmitted to the FFT unit 226, the imaginary part Ch_IM with an inverse sign (i.e., (−1)*Ch_IM) becomes a real part transmitted to the FFT unit 226, the real part Data_RE becomes an imaginary part inputted to the FFT unit 227, and the imaginary part Data_IM becomes a real part inputted to the FFT unit 227.

As shown in FIG. 9, the adjustment made to at least one of the real part Data_RE and the imaginary part Data_IM of the transmitted data occurs after the filter/synchronization circuit 222. Therefore, there is no need to re-do the channel synchronization and channel estimation which may take a lot of frames to re-converge to a good condition. As a result, the overall performance of the DTMB receiver is improved.

Figure 10:
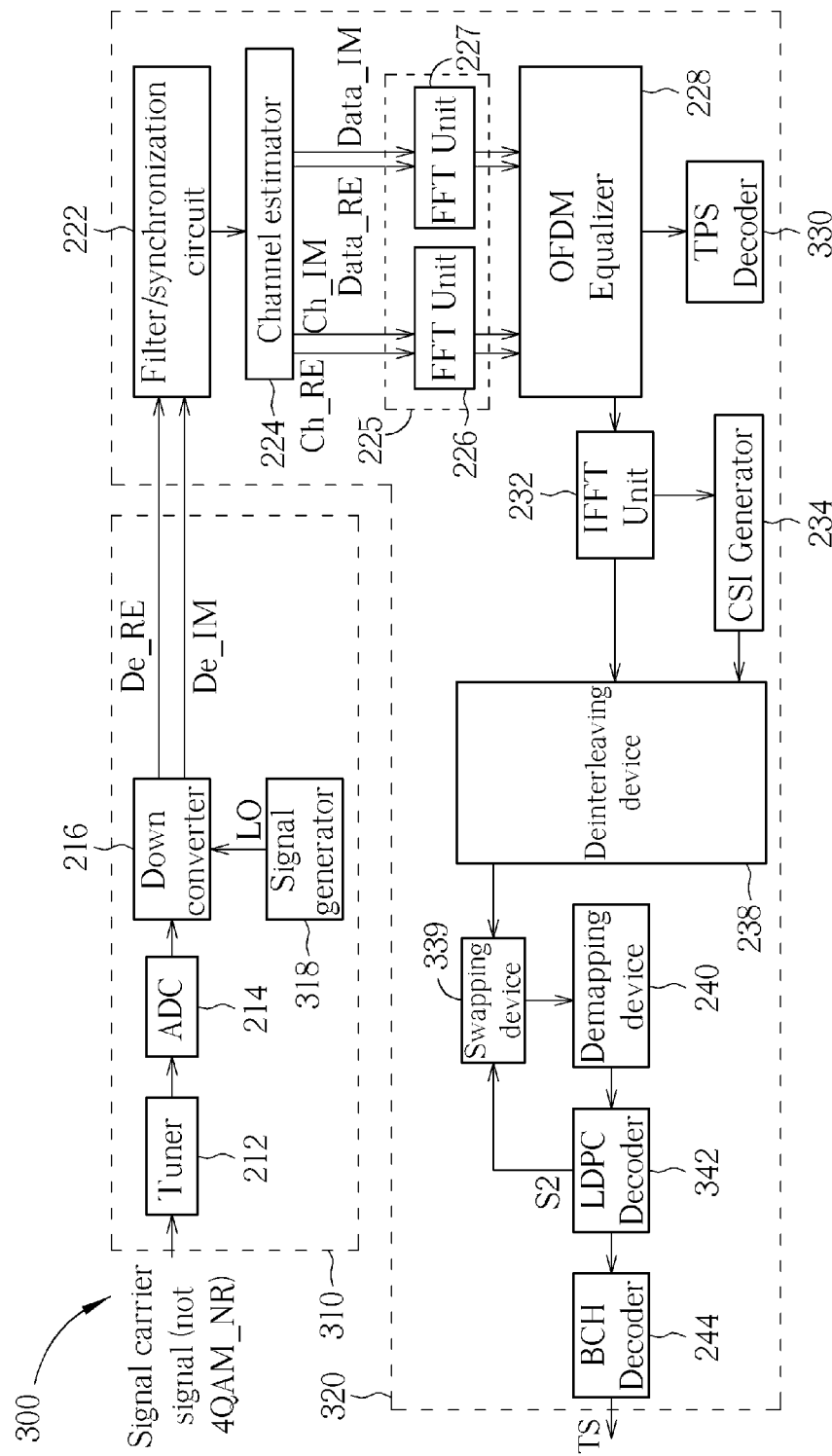
FIG. 10 is a diagram illustrating a fifth operational scenario of the DTMB receiver shown in FIG. 2.

FIG. 10 is a diagram illustrating a fifth operational scenario of the DTMB receiver 300 shown in FIG. 2. Please note that only the components pertinent to illustrating this operational scenario are shown in FIG. 10 for simplicity and clarity. In this case, the signal mode detector 302 shown in FIG. 2 identifies that the wireless communication signal is a non-NR-coded single carrier signal. For example, the signal mode of the wireless communication signal which is a single carrier signal is not a 4QAM_NR mode. In addition, the spectrum direction verifying scheme supported by the LDPC decoder 342 is selected and enabled, and LDPC decoder 342 outputs a control signal S2 to the swapping device 339 when the spectrum inversion is detected by the spectrum direction verifying scheme thereof. That is, the LDPC decoder 342 performs an LDPC decoding operation upon a demapped signal generated from the demapping device 240 to generate an LDPC decoding result (e.g., a parity check result) for each spectrum direction, and then verifies the spectrum direction of the non-NR-coded single carrier signal according to the LDPC decoding results. When the spectrum inversion is detected, the LDPC decoder 342 generates the control signal S2 to enable the swapping device 339 to swap the real part and the imaginary part of an input received by the demapping device 240. For example, when the spectrum inversion is detected using the LDPC decoding result, the real part and imaginary part of an incoming signal (i.e., a deinterleaved signal generated from the deinterleaving device 238) respectively become an imaginary part and a real part inputted to the demapping device 240.

As shown in FIG. 10, the swapping of the real part and the imaginary part occurs after the filter/synchronization circuit 222. Therefore, there is no need to re-do the channel synchronization and channel estimation which may take a lot of frames to re-converge to a good condition. In addition, the swapping of the real part and the imaginary part occurs after the deinterleaving device 238, which saves the time needed for the OFDM equalizer to be stable and the time needed for doing the deinterleaving. As a result, the overall performance of the DTMB receiver is improved greatly.

Figure 11:
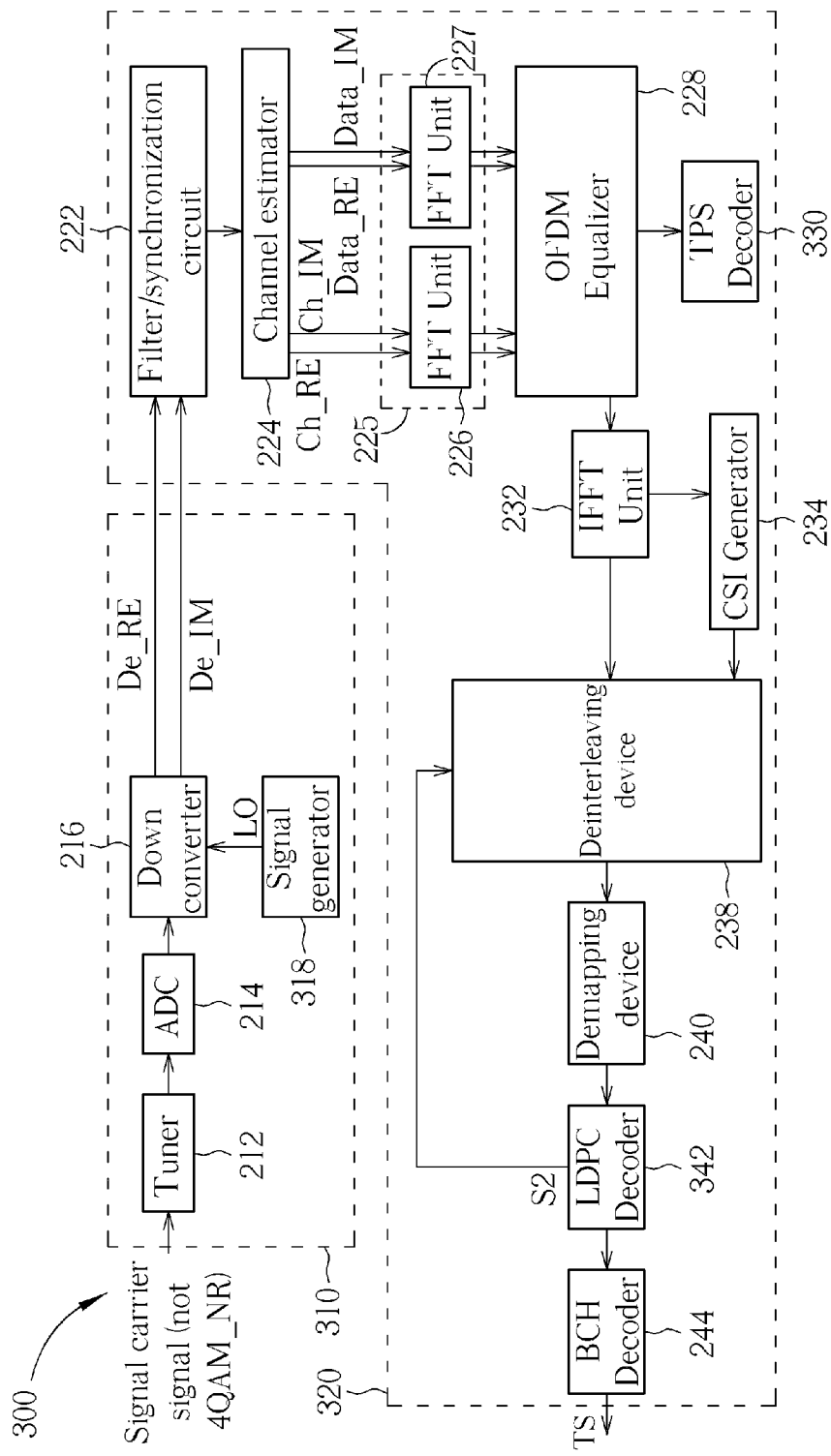
FIG. 11 is a diagram illustrating a sixth operational scenario of the DTMB receiver shown in FIG. 2.

FIG. 11 is a diagram illustrating a sixth operational scenario of the DTMB receiver 300 shown in FIG. 2. Please note that only the components pertinent to illustrating this operational scenario are shown in FIG. 11 for simplicity and clarity. In this case, the signal mode detector 302 shown in FIG. 2 identifies that the wireless communication signal is a non-NR-coded single carrier signal. For example, the signal mode of the wireless communication signal which is a single carrier signal is not a 4QAM_NR mode. In addition, the spectrum direction verifying scheme supported by the LDPC decoder 342 is selected and enabled, and LDPC decoder 342 outputs a control signal S2 to the deinterleaving device 238 when the spectrum inversion is detected by the spectrum direction verifying scheme thereof. When the spectrum inversion is detected, the LDPC decoder 342 generates the control signal S2 to notify the deinterleaving device 238 to swap the real part and the imaginary part of the deinterleaved signal outputted to the demapping device 240 by swapping the memory addresses of the real part and the imaginary part of the deinterleaved signal requested by the demapping device 240. In other words, as the deinterleaving result is generally stored in a memory (not shown), the demapping device 240 can swap the memory address for retrieving the real part buffered in the memory and the memory address for retrieving the imaginary part buffered in the memory, thereby achieving the same objective of swapping the real part and the imaginary part outputted to the demapping device 240.

As shown in FIG. 11, the swapping of the real part and the imaginary part occurs after the filter/synchronization circuit 222. Therefore, there is no need to re-do the channel synchronization and channel estimation which may take a lot of frames to re-converge to a good condition. In addition, the swapping of the real part and the imaginary part occurs after the deinterleaving result is generated, which saves the time needed for the OFDM equalizer to be stable and the time needed for doing the deinterleaving. As a result, the overall performance of the DTMB receiver is improved greatly.

Figure 12:
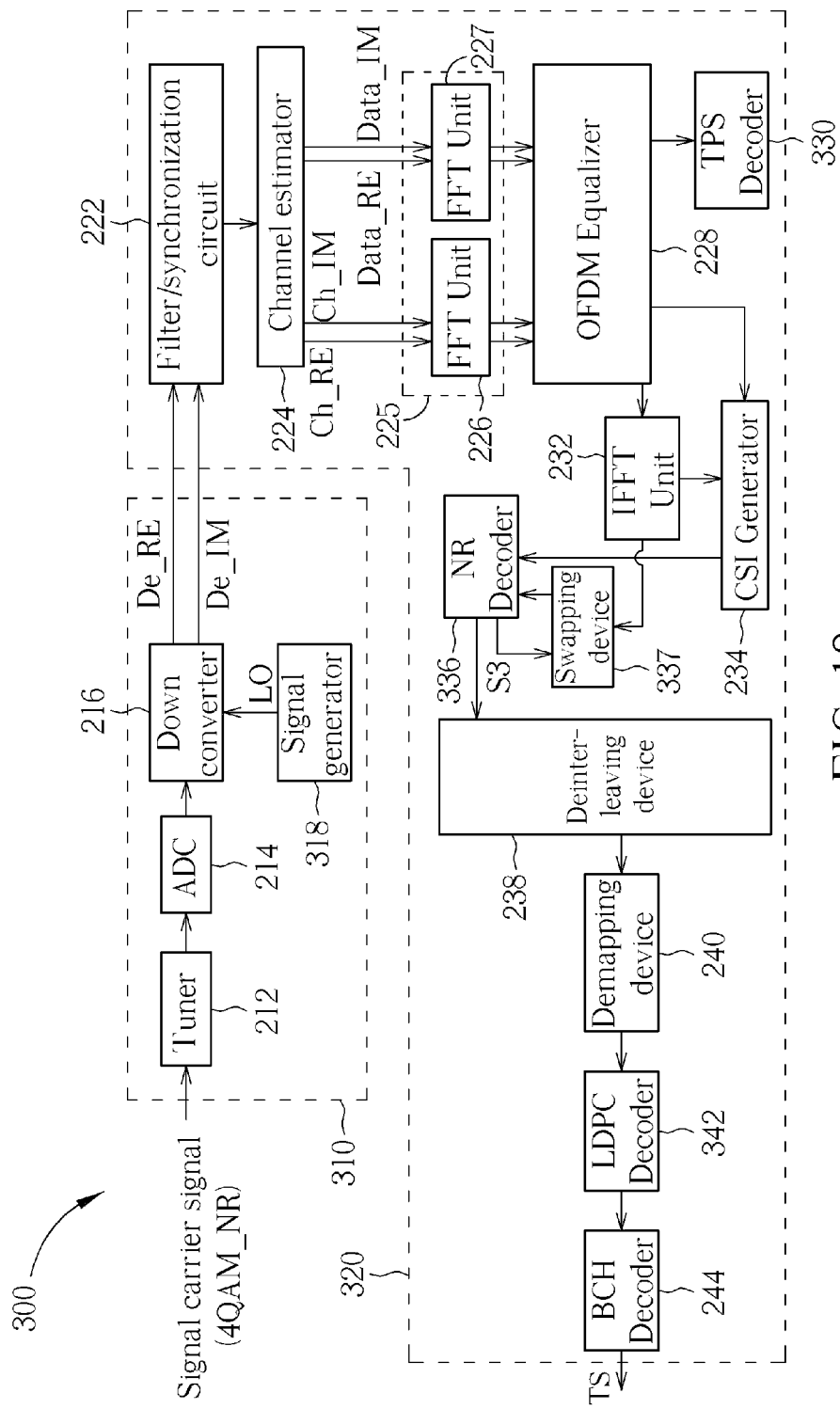
FIG. 12 is a diagram illustrating a seventh operational scenario of the DTMB receiver shown in FIG. 2.

FIG. 12 is a diagram illustrating a seventh operational scenario of the DTMB receiver 300 shown in FIG. 2. Please note that only the components pertinent to illustrating this operational scenario are shown in FIG. 12 for simplicity and clarity. In this case, the signal mode detector 302 shown in FIG. 2 identifies that the wireless communication signal is an NR-coded single carrier signal. For example, the signal mode of the wireless communication signal which is a single carrier signal is a 4QAM_NR mode. In addition, the spectrum direction verifying scheme supported by the NR decoder 336 is selected and enabled, and the NR decoder 336 outputs a control signal S3 to the swapping device 337 when the spectrum inversion is detected by the spectrum direction verifying scheme thereof. As the NR code is sensitive to the spectrum direction, the NR decoding result can be used to detect the occurrence of the spectrum inversion. That is, the NR decoder 336 performs an NR decoding operation to generate an NR decoding result, and then verifies the spectrum direction of the received NR-coded single carrier signal according to the NR decoding result. In the transmitter end, the NR mapping is implemented to map incoming 8 bits to 16 bits. Specifically, 8 derived bits serving as parity bits are obtained from the incoming 8 bits, and then appended to the incoming 8 bits. The NR decoding result therefore includes 8 soft bits, and the NR decoder 336 refers to magnitude of the soft bits to determine whether the spectrum inversion occurs. In general, the greater is the soft bit magnitude, the better the reliability of the spectrum direction is. In one exemplary implementation, the NR decoder 336 generates soft bits for the first spectrum direction and soft bits for the second spectrum direction opposite to the first spectrum direction, and then determines which spectrum direction the DTMB receiver 300 should adapt itself to for recovering the correct data transmitted from the transmitter end by comparing the soft bit magnitudes. Preferably, the NR decoding outputs of a plurality of frames can be accumulated, and then the NR decoder 336 makes decision according to the accumulated values corresponding to the first and second spectrum directions. In an alternative design, the NR decoder 336 generates soft bits for the current spectrum direction only, and then compares the soft bit magnitude with a predetermined threshold. When the soft bit magnitude does not exceed the predetermined threshold, the NR decoder 336 determines that the current spectrum direction is incorrect. Similarly, the NR decoding outputs of a plurality of frames can be accumulated, and then the NR decoder 336 compares an accumulated value with a predetermined threshold to make decision.

When the spectrum inversion is detected, the NR decoder 336 generates the control signal S3 to enable the swapping device 337 to swap the real part and the imaginary part of an input received by the NR decoder 336. For example, when the spectrum inversion is detected using the NR decoding result, the real part and imaginary part of an incoming signal (i.e., an IFFT output) respectively become an imaginary part and a real part inputted to the NR decoder 336.

As shown in FIG. 12, the spectrum direction detection is performed before the deinterleaving device 238 which requires much time on deinterleaving its input, therefore shortening the time required for checking the spectrum direction. In addition, the swapping of the real part and the imaginary part occurs after the filter/synchronization circuit 222. Therefore, there is no need to re-do the channel synchronization and channel estimation which may take a lot of frames to re-converge to a good condition. Furthermore, the swapping of the real part and the imaginary part occurs after the deinterleaving result is generated, which saves the time needed for the OFDM equalizer to be stable and the time needed for doing the deinterleaving. As a result, the overall performance of the DTMB receiver is improved greatly.

In the exemplary embodiment shown in FIG. 12, the NR decoding result is used to verify the spectrum direction of a single carrier signal modulated using a 4QAM_NR mode. However, this is for illustrative purpose only, and is not meant to be a limitation of the present invention. In other words, the same conception of using an NR decoding result to verify the spectrum direction could be applied to any NR-coded wireless communication signal, such as an OFDM signal (i.e., a multi-carrier signal) modulated using a 4QAM_NR mode.

Figure 13:
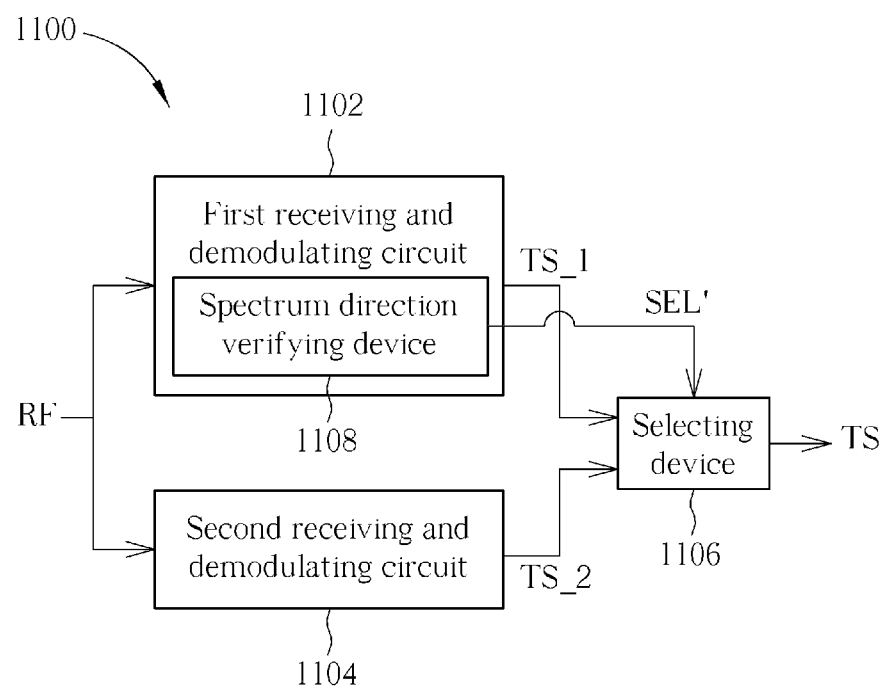
FIG. 13 is a block diagram illustrating another exemplary embodiment of an apparatus for processing a wireless communication signal according to the present invention.

FIG. 13 is a block diagram illustrating another exemplary embodiment of an apparatus for processing a wireless communication signal according to the present invention. In this embodiment, the apparatus for processing a wireless communication signal is a DTMB receiver 1100 for processing a wireless communication signal RF complying with a DTMB standard. The exemplary DTMB receiver 1100 includes, but is not limited to, a first receiving and demodulating circuit 1102, a second receiving and demodulating circuit 1104, and a selecting device 1106. The first receiving and demodulating circuit 1102 is implemented for receiving the wireless communication signal RF and then demodulating the received wireless communication signal RF to generate a first transport stream TS_1 based on a first spectrum direction. The second receiving and demodulating circuit 1104 is implemented for receiving the wireless communication signal RF and then demodulating the received wireless communication signal RF to generate a second transport stream TS_2 based on a second spectrum direction different from the first spectrum direction. In addition, at least one of the first receiving and demodulating circuit 1102 and the second receiving and demodulating circuit 1104 includes a spectrum direction verifying device configured to verify a spectrum direction of the wireless communication signal RF. In this exemplary embodiment, a spectrum direction verifying device 1108 in the first demodulation block detects if the first spectrum direction is the correct spectrum direction of the wireless communication signal RF. For example, the spectrum direction verifying device 1108 could be implemented using a TPS decoder, and NR decoder, an LDPC decoder, or a combination thereof, depending upon design considerations. The selecting device 1106 is coupled to the first and second receiving and demodulating circuits, for selectively outputting the first transport stream TS_1 or the second transport stream TS_2 as a transport stream TS of the DTMB receiver 1100 according to the spectrum direction of the wireless communication signal RF verified by the spectrum direction verifying device 1108. For example, when the spectrum direction verifying device 1108 detects the spectrum inversion, implying that the second spectrum direction should be the correct spectrum direction of the wireless communication signal RF, the spectrum direction verifying device 1108 outputs a control signal SEL' to the selecting device 1106, and then the selecting device 1106 selects the second transport stream TS_2 as an output of the DTMB receiver 1100; otherwise, the selecting device 1106 selects the first transport stream TS_1 as the output of the DTMB receiver 1100.

Please note that though the first and second receiving and demodulating circuit 1102 and 1104 are shown as individual functional blocks, this does not imply that the components in the first and second receiving and demodulating circuits 1102, 1104 are physically independent of each other. For example, in an exemplary implementation, the first receiving and demodulating circuit 1102 and the second receiving and demodulating circuit 1104 can share the same tuner 212, ADC 214, and down converter 216 shown in FIG. 2.

As shown in FIG. 13, the wireless communication signal RF is processed by the first and second receiving and demodulating circuits 1102 and 1104 in a parallel processing manner, and then the selecting device 1106 selects one of the first and second transport streams TS_1 and TS_2 as an output of the DTMB receiver 1100. Therefore, there is no need to re-do the channel estimation which may take a lot of frames to re-converge to a good condition. As a result, the overall performance of the DTMB receiver is improved.

Those skilled in the art will readily observe that numerous modifications and alterations of the device and method may be made while retaining the teachings of the invention.

What is claimed is:
1. An apparatus for processing a time domain synchronous orthogonal frequency-division-multiplexing (TDS-OFDM) signal, comprising:
   a receiving block, for receiving the TDS-OFDM signal and generating a down-converted signal according to the received TDS-OFDM signal; and
   a demodulating block, coupled to the receiving block, for demodulating the down-converted signal to generate a transport stream, the demodulating block comprising:
      a transmission parameter signaling (TPS) decoder, for performing a TPS decoding operation to generate a TPS decoding result, and automatically verifying a spectrum direction of the received TDS-OFDM signal according to the TPS decoding result;
   wherein the TPS decoder verifies the spectrum direction of the received TDS-OFDM signal according to a first decoded codeword corresponding to a first spectrum direction and a second decoded codeword corresponding to a second spectrum direction different from the first spectrum direction; and the TPS decoder generates the TPS decoding result by:
      decoding TPS information to obtain a derived codeword, finding one of a plurality of predetermined codewords that is most similar or identical to the derived codeword to identify the first decoded codeword, remapping the derived codeword to obtain a remapped codeword, and finding one of the predetermined codewords that is most similar or identical to the remapped codeword to identify the second decoded codeword.

2. The apparatus of claim 1, wherein the demodulating block further comprises a fast Fourier transform (FFT) device; and the demodulating block selectively adjusts at least one of a real part and an imaginary part of inputs received by the FFT device according to the spectrum direction verified by the TPS decoder, wherein the inputs comprise a data part and a channel part.

3. The apparatus of claim 2, wherein the TPS decoder generates a control signal when detecting a spectrum inversion, and the demodulating block further comprises:
an adjusting device, coupled to the TPS decoder and the FFT device, for adjusting at least one of a real part and an imaginary part of incoming signals according to the control signal generated from the TPS decoder, thereby adjusting at least one of the real part and the imaginary part of each of the data part and the channel part received by the FFT device.

4. The apparatus of claim 1, wherein the demodulating block further comprises a synchronization circuit for performing a synchronization operation according to the down-converted signal; and the receiving block selectively swaps a real part and an imaginary part of the down-converted signal or inverts sign of one of the real part and the imaginary part of the down-converted signal according to the spectrum direction verified by the TPS decoder.

5. An apparatus for processing a time domain synchronous orthogonal frequency-division-multiplexing (TDS-OFDM) signal, comprising:
a receiving block, for receiving the TDS-OFDM signal and generating a down-converted signal according to the received TDS-OFDM signal; and
a demodulating block, coupled to the receiving block, for demodulating the down-converted signal to generate a transport stream, the demodulating block comprising:
a low density parity check (LDPC) decoder, for performing an LDPC decoding operation to generate an LDPC decoding result and automatically verifying a spectrum direction of the received TDS-OFDM signal according to the LDPC decoding result; and
a fast Fourier transform (FFT) device;
wherein the demodulating block selectively adjusts at least one of a real part and an imaginary part of inputs received by the FFT device according to the spectrum direction verified by the LDPC decoder, wherein the inputs comprise a data part and a channel part;
wherein the LDPC decoder performs one LDPC decoding operation to generate a first parity check result for a first spectrum direction, performs another LDPC decoding operation to generate a second parity check result for a second spectrum direction different from the first spectrum direction, determines the spectrum direction of the received TDS-OFDM signal to be the first spectrum direction when the first parity check result has fewer parity check errors than the second parity check result, and determines the spectrum direction of the received TDS-OFDM signal to be the second spectrum direction when the second parity check result has fewer parity check errors than the first parity check result.

6. The apparatus of claim 5, wherein the LDPC decoder generates a control signal when detecting a spectrum inversion, and the demodulating block further comprises:
an adjusting device, coupled to the LDPC decoder and the FFT device, for adjusting at least one of a real part and an imaginary part of incoming signals according to the control signal generated from the LDPC decoder, thereby adjusting at least one of the real part and the imaginary part of each of the data part and the channel part received by the FFT device.

7. An apparatus for processing a non-Nordstrom-Robinson (NR)-coded single carrier signal, comprising:
a receiving block, for receiving the non-NR-coded single carrier signal and generating a down-converted signal according to the received non-NR-coded single carrier signal; and
a demodulating block, coupled to the receiving block, for demodulating the down-converted signal to generate a transport stream, the demodulating block comprising:
a demapping device, for generate a demapped signal; and
a low density parity check (LDPC) decoder, coupled to the demapping device, for decoding the demapped signal to generate an LDPC decoding result, and automatically verifying a spectrum direction of the received non-NR-coded single carrier signal according to the LDPC decoding result;
wherein the demodulating block selectively swaps a real part and an imaginary part of an input received by the demapping device according to the spectrum direction verified by the LDPC decoder; and the LDPC decoder performs one LDPC decoding operation to generate a first parity check result for a first spectrum direction, performs another LDPC decoding operation to generate a second parity check result for a second spectrum direction different from the first spectrum direction, determines the spectrum direction of the received non-NR-coded single carrier signal to be the first spectrum direction when the first parity check result has fewer parity check errors than the second parity check result, and determines the spectrum direction of the received non-NR-coded single carrier signal to be the second spectrum direction when the second parity check result has fewer parity check errors than the first parity check result.

8. The apparatus of claim 7, wherein the LDPC decoder generates a control signal when detecting a spectrum inversion, and the demodulating block further comprises:
a swapping device, coupled to the demapping device and the LDPC decoder, for swapping a real part and an imaginary part of an incoming signal to be processed by the demapping device according to the control signal generated from the LDPC decoder, thereby swapping the real part and the imaginary part of the input received by the demapping device.

9. The apparatus of claim 7, wherein the LDPC decoder generates a control signal when detecting a spectrum inversion, the demapping device generates the demapped signal according to an interleaved signal, and the demodulating block further comprises:
a deinterleaving device, coupled to the demapping device and the LDPC decoder, for generating the interleaved signal, and swapping a real part and an imaginary part of the deinterleaved signal outputted to the demapping device according to the control signal generated from the LDPC decoder.

10. An apparatus for processing a Nordstrom-Robinson (NR)-coded wireless communication signal, comprising:
a receiving block, for receiving the NR-coded wireless communication signal and generating a down-converted signal according to the received NR-coded wireless communication signal; and
a demodulating block, coupled to the receiving block, for demodulating the down-converted signal to generate a transport stream, the demodulating block comprising:

an NR decoder, for performing an NR decoding operation to generate an NR decoding result, and automatically verifying a spectrum direction of the received NR-coded wireless communication signal according to the NR decoding result;

wherein the demodulating block selectively swaps a real part and an imaginary part of an input received by the NR decoder according to the spectrum direction verified by the NR decoder; and the NR decoder performs the NR decoding operation to generate soft bits for a current spectrum direction, and verifies the spectrum direction of the received NR-coded wireless communication signal by performing comparison based on magnitude of the soft bits and a predetermined threshold.

11. The apparatus of claim 10, wherein the received NR-coded wireless communication signal is an NR-coded single carrier signal, the NR decoder generates a control signal when detecting a spectrum inversion, and the demodulating block further comprises:

a swapping device, coupled to the NR decoder, for swapping a real part and an imaginary part of an incoming signal to be processed by the NR decoder according to the control signal generated from the NR decoder, thereby swapping the real part and the imaginary part of the input received by the NR decoder.

12. An apparatus for processing a wireless communication signal, comprising:

a first receiving and demodulating circuit, for receiving the wireless communication signal and demodulating the received wireless communication signal to generate a first transport stream based on a first spectrum direction;

a second receiving and demodulating circuit, for receiving the wireless communication signal and demodulating the received wireless communication signal to generate a second transport stream based on a second spectrum direction different from the first spectrum direction, wherein at least one of the first receiving and demodulating circuit and the second receiving and demodulating circuit comprises a spectrum direction verifying device configured to verify a spectrum direction of the received wireless communication signal; and a selecting device, coupled to the first receiving and demodulating circuit and the second receiving and demodulating circuit, for selectively outputting an unmodified form of the first transport stream or an unmodified form of the second transport stream according to the spectrum direction of the wireless communication signal verified by the spectrum direction verifying device, wherein when the spectrum direction of the received wireless communication signal is verified to be the first spectrum direction, the selecting device outputs the unmodified form of the first transport stream, and when the spectrum direction of the received wireless communication signal is verified to be the second spectrum direction, the selecting device outputs the unmodified form of the second transport stream.

13. The apparatus of claim 12, wherein the wireless communication signal complies with a digital terrestrial television multimedia broadcasting (DTMB) standard.

14. The apparatus of claim 12, wherein the spectrum direction verifying device comprises a transmission parameter signaling (TPS) decoder, a Nordstrom-Robinson (NR) decoder, or a low density parity check (LDPC) decoder.

15. A method for processing a time domain synchronous orthogonal frequency-division-multiplexing (TDS-OFDM) signal, comprising:

receiving the TDS-OFDM signal and generating a down-converted signal according to the received TDS-OFDM signal; and demodulating the down-converted signal to generate a transport stream, comprising:

performing a transmission parameter signaling (TPS) decoding operation to generate a TPS decoding result; and automatically verifying a spectrum direction of the received TDS-OFDM signal according to the TPS decoding result;

wherein the step of verifying the spectrum of the received TDS-OFDM signal comprises:

verifying the spectrum direction of the received TDS-OFDM signal according to a first decoded codeword corresponding to a first spectrum direction and a second decoded codeword corresponding to a second spectrum direction different from the first spectrum direction; and the step of performing the TPS decoding operation to generate the TPS decoding result comprises:

decoding TPS information to obtain a derived codeword, finding one of a plurality of predetermined codewords that is most similar or identical to the derived codeword to identify the first decoded codeword, remapping the derived codeword to obtain a remapped codeword, and finding one of the predetermined codewords that is most similar or identical to the remapped codeword to identify the second decoded codeword.

16. The method of claim 15, wherein demodulating the down-converted signal to generate the transport stream further comprises:

performing a fast Fourier transform (FFT) operation; and selectively adjusting at least one of a real part and an imaginary part of inputs received by the FFT operation according to the spectrum direction verified according to the TPS decoding result, wherein the inputs comprise a data part and a channel part.

17. The method of claim 16, wherein selectively adjusting at least one of the real part and the imaginary part of the inputs received by the FFT operation comprises:

receiving incoming signals; and when the TPS decoding result indicates a spectrum inversion, adjusting at least one of a real part and an imaginary part of the received incoming signals to thereby adjust at least one of the real part and the imaginary part of each of the data part and the channel part received by the FFT operation.

18. The method of claim 15, wherein demodulating the down-converted signal to generate the transport stream further comprises: performing a synchronization operation according to the down-converted signal; and generating the down-converted signal according to the received TDS-OFDM signal comprises:

selectively swapping a real part and an imaginary part of the down-converted signal or inverting sign of one of the real part and the imaginary part of the down-converted signal according to the spectrum direction verified according to the TPS decoding result.

19. An apparatus for processing a time domain synchronous orthogonal frequency-division-multiplexing (TDS-OFDM) signal, comprising:

a receiving block, for receiving the TDS-OFDM signal and generating a down-converted signal according to the received TDS-OFDM signal; and a demodulating block, coupled to the receiving block, for demodulating the down-converted signal to generate a transport stream, the demodulating block comprising:
  a transmission parameter signaling (TPS) decoder, for performing a TPS decoding operation to generate a TPS decoding result, and automatically verifying a spectrum direction of the received TDS-OFDM signal according to the TPS decoding result;
  wherein the TPS decoder verifies the spectrum direction of the received TDS-OFDM signal according to a first decoded codeword corresponding to a first spectrum direction and a second decoded codeword corresponding to a second spectrum direction different from the first spectrum direction; and the TPS decoder generates the TPS decoding result by:
    decoding the TPS information to obtain the derived codeword, finding one of the predetermined codewords that is most similar or identical to the derived codeword to identify the first decoded codeword, remapping the predetermined codewords to obtain a plurality of remapped codewords, and finding one of the remapped codewords that is most similar or identical to the derived codeword to identify the second decoded codeword.

20. A method for processing a time domain synchronous orthogonal frequency-division-multiplexing (TDS-OFDM) signal, comprising:
  receiving the TDS-OFDM signal and generating a down-converted signal according to the received TDS-OFDM signal; and
  demodulating the down-converted signal to generate a transport stream, comprising:
    performing a transmission parameter signaling (TPS) decoding operation to generate a TPS decoding result; and
  automatically verifying a spectrum direction of the received TDS-OFDM signal according to the TPS decoding result;
  wherein the step of verifying the spectrum of the received TDS-OFDM signal comprises:
    verifying the spectrum direction of the received TDS-OFDM signal according to a first decoded codeword corresponding to a first spectrum direction and a second decoded codeword corresponding to a second spectrum direction different from the first spectrum direction; and
  the step of performing the TPS decoding operation to generate the TPS decoding result comprises:
    decoding the TPS information to obtain the derived codeword, finding one of the predetermined codewords that is most similar or identical to the derived codeword to identify the first decoded codeword, remapping the predetermined codewords to obtain a plurality of remapped codewords; and finding one of the remapped codewords that is most similar or identical to the derived codeword to identify the second decoded codeword.

* * * * *